(12) United States Patent
Walke et al.

(10) Patent No.: US 10,673,564 B1
(45) Date of Patent: Jun. 2, 2020

(54) SOFTWARE DEFINED MODEM

(71) Applicant: Xilinx, Inc., San Jose, CA (US)

(72) Inventors: Richard L. Walke, Edinburgh (GB); Christopher H. Dick, San Jose, CA (US); William A. Wilkie, Edinburgh (GB)

(73) Assignee: Xilinx, Inc., San Jose, CA (US)

( * ) Notice: Subject to any disclaimer, the term of this patent is extended or adjusted under 35 U.S.C. 154(b) by 69 days.

(21) Appl. No.: 16/138,414

(22) Filed: Sep. 21, 2018

(51) Int. Cl.
*H04L 1/00* (2006.01)
*H03M 13/29* (2006.01)
*H03M 13/45* (2006.01)
*H03M 13/11* (2006.01)
*H04B 1/38* (2015.01)

(52) U.S. Cl.
CPC ....... *H04L 1/0058* (2013.01); *H03M 13/1102* (2013.01); *H03M 13/2957* (2013.01); *H03M 13/2963* (2013.01); *H03M 13/45* (2013.01); *H04B 1/38* (2013.01)

(58) Field of Classification Search
CPC . H04L 1/0058; H03M 13/1102; H03M 13/45; H03M 13/2957; H03M 13/2963; H04B 1/38
USPC ........ 714/776, 752, 786, 821; 375/222, 224; 370/241, 242; 725/111
See application file for complete search history.

(56) References Cited

U.S. PATENT DOCUMENTS

| | | | |
|---|---|---|---|
| 5,896,414 A * | 4/1999 | Meyer | H04H 20/38 348/E7.07 |
| 6,476,739 B1 * | 11/2002 | Lui | H03M 13/4146 341/107 |
| 7,539,926 B1 | 5/2009 | Lesea | |
| 7,729,617 B2 * | 6/2010 | Sheth | H04B 10/801 370/465 |
| 8,340,234 B1 * | 12/2012 | Cheng | H04L 25/0212 375/348 |
| 9,071,364 B1 * | 6/2015 | Voois | H04B 10/2507 |
| 9,083,383 B1 | 7/2015 | Tunali et al. | |
| 9,203,440 B1 | 12/2015 | Tunali et al. | |
| 9,337,934 B1 * | 5/2016 | Agazzi | H04B 10/516 |
| 9,413,390 B1 | 8/2016 | Yin et al. | |
| 9,667,276 B1 | 5/2017 | Tunali et al. | |
| 9,838,131 B1 * | 12/2017 | Voois | H04B 10/58 |
| 2010/0309805 A1 * | 12/2010 | Jones, Jr. | H04L 12/2801 370/252 |
| 2013/0089126 A1 * | 4/2013 | Walker | H04L 1/0047 375/224 |
| 2014/0123203 A1 * | 5/2014 | Oliver | H04N 7/102 725/125 |

(Continued)

OTHER PUBLICATIONS

Faust et al., FEC-based 4 Gb/s Backplane Transceiver in 90nm CMOS, Sep. 2012, IEEE, pp. 2-5. (Year: 2012).*

(Continued)

*Primary Examiner* — John J Tabone, Jr.
(74) *Attorney, Agent, or Firm* — Kevin T. Cuenot

(57) ABSTRACT

A modem includes an outer transceiver including a soft decision forward error correction (SD-FEC) circuit, wherein the SD-FEC circuit is hardwired and programmable to perform at least one of encoding or decoding data using a code type selected from a plurality of different code types, and an inner transceiver coupled to the SD-FEC circuit, wherein the inner transceiver is implemented in programmable circuitry.

20 Claims, 11 Drawing Sheets

(56) References Cited

U.S. PATENT DOCUMENTS

| | | | | |
|---|---|---|---|---|
| 2016/0373138 | A1* | 12/2016 | Li | H04L 1/0009 |
| 2017/0317759 | A1* | 11/2017 | Agazzi | H04L 7/0075 |
| 2019/0268110 | A1* | 8/2019 | Pepper | H04L 1/0057 |

OTHER PUBLICATIONS

Onohara et al. Soft-Decision-Based Forward Error Correction for 100 Gb/s Transport Systems, 2010, IEEE, vol. 16, No. 5, pp. 1258-1267. (Year: 2010).*

Ren et al., FPGA Implementation of an OFDM Modem, Dec. 1, 2009, IEEE, pp. 761-764. (Year: 2009).*

Chacko et al., FPGA-Based Latency-Insensitive OFDM Pipeline for Wireless Research, 2014, IEEE, pp. 1-6. (Year: 2014).*

Grayver et al., Multi-Modulation Programmable Transceiver System with Turbo Coding, 2005, IEEE, pp. 1-10. (Year: 2005).*

Nelson et al., A Robust Real-Time 100G Transceiver With Soft-Decision Forward Error Correction, Nov. 2012, IEEE, vol. 4, No. 11, pp. B131-B141. (Year: 2012).*

Rasmussen et al, Improved Energy Efficiency for Optical Transport Networks by Elastic Forward Error Correction, Apr. 2014, IEEE, vol. 6, No. 4, pp. 397-407. (Year: 2014).*

Mansour, Mohammad M., "A Turbo-Decoding Message-Passing Algorithm for Sparse Parity-Check Matrix Codes," IEEE Transactions of Signal Processing, vol. 54, No. 11, Nov. 2006, pp. 4376-4392.

Emran, Ahmed A. et al., "Simplified Variable-Scaled Min Sum LDPC Decoder for irregular LDPC Codes," Electronics and Communications Engineering Department, E-JUST University, CNNC: Networking Issues in Multimedia Entertainment, 2014, pp. 518-523.

Xilinx, "Vivado Design Suite User Guide," Release Note, Installation, and Licensing, UG973 (v2017.3), Oct. 4, 2017, 88 pg., Xilinx, Inc., San Jose, California, USA.

Xilinx, "Zynq UltraScale+ RFSoC Data Sheet: Overview," Advance Product Specification DS889 (v1.4), May 17, 2018, 33 pg., Xilinx, Inc., San Jose, California, USA.

Xilinx, "Soft-Decision FEC Integrated Block," LogiCORE IP Product Guide, Vivado Design Suite, PG256, Jun. 18, 2018, 134 pg., Xilinx, Inc., San Jose, California, USA.

Xilinx, "Xilinx Delivers Zynq UltraScale+ RFSoC Family Integrating the RF Signal Chain for 5G Wireless, Cable Remote-PHY, and Radar," Xilinx, Inc. Press Release, Oct. 3, 2017, 3 pg., Xilinx, Inc., San Jose, California, USA.

Xilinx, "LDPC Encoder / Decoder," Xilinx, Inc. Part No. EF-DI-LDPC-ENC-DEC-SITE, [retrieved May 21, 2018], 3 pg., Xilinx, Inc., San Jose, California, USA.

Xilinx, "Zynq UltraScale+RFSoCs," Xilinx, Inc., [retrieved May 21, 2018] from the Internet: <https://www.xilinx.com/products/silicon-devices/soc/rfsoc.html>, 7 pg.

Specification and drawings for U.S. Appl. No. 15/688,628, filed Aug. 28, 2017, Tunali et al.

Specification and drawings for U.S. Appl. No. 15/938,760, filed Mar. 28, 2018, Walke et al.W.

Specification and drawings for U.S. Appl. No. 16/112,588, filed Aug. 24, 2018, Walke et al.

Specification and drawings for U.S. Appl. No. 16/137,927, filed Sep. 21, 2018, Walke et al.

Specification and drawings for U.S. Appl. No. 16/137,935, filed Sep. 21, 2018, Walke et al.

* cited by examiner

SOFTWARE DEFINED MODEM

TECHNICAL FIELD

This disclosure relates to integrated circuits (ICs) and, more particularly, to a software defined modem implemented in hardware within an IC.

BACKGROUND

Integrated circuits (ICs) can be implemented to perform a variety of functions. Some ICs can be programmed to perform specified functions. One example of an IC that can be programmed is a field programmable gate array (FPGA). An FPGA typically includes an array of programmable tiles. These programmable tiles may include, for example, input/output blocks (IOBs), configurable logic blocks (CLBs), dedicated random access memory blocks (BRAMs), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that may include, for example, function generators, registers, arithmetic logic, and so forth.

The programmable interconnect and programmable logic circuitries are typically programmed by loading a stream of configuration data into internal configuration memory cells that define how the programmable elements are configured. The configuration data can be read from memory (e.g., from an external programmable read-only memory or "PROM") or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits may be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs may also be implemented in other ways, e.g., using fuse or antifuse technology. The phrase "programmable IC" may include, but is not limited to, these devices and further may encompass devices that are only partially programmable. For example, one type of programmable IC includes a combination of hard-coded transistor logic and a programmable switch fabric that programmably interconnects the hard-coded transistor logic.

SUMMARY

In one or more embodiments, a modem includes an outer transceiver including a soft decision forward error correction (SD-FEC) circuit, wherein the SD-FEC circuit is hardwired and programmable to perform at least one of encoding or decoding data using a code type selected from a plurality of different code types, and an inner transceiver coupled to the SD-FEC circuit, wherein the inner transceiver is implemented in programmable circuitry.

In one or more embodiments, a method of implementing a modem includes providing an outer transceiver including an SD-FEC circuit, wherein the SD-FEC circuit is hardwired and programmable to perform at least one of encoding or decoding data using a code type selected from a plurality of different code types, and providing an inner transceiver coupled to the SD-FEC circuit, wherein the inner transceiver is implemented in programmable circuitry.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
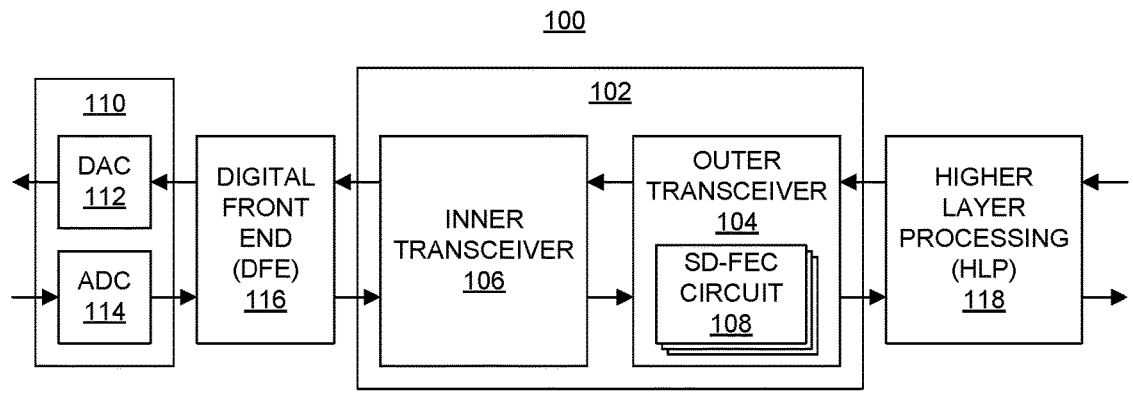
FIG. 1 illustrates a system including an example software defined modem.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to a software defined modem implemented within an IC. In accordance with the inventive arrangements described within this disclosure, a software defined modem is implemented in hardware within an IC that has software defined features and at least some software defined circuitry. In one or more embodiments, the software defined modem includes an outer transceiver and an inner transceiver. The outer transceiver includes one or more hardwired circuit blocks. The hardwired circuit block(s) of the outer transceiver are software configurable. The inner transceiver is coupled to the outer transceiver. The inner transceiver includes one or more circuit blocks implemented using programmable circuitry of the IC.

In one or more embodiments, the outer transceiver includes one or more soft-decision forward error correction (SD-FEC) circuits. An SD-FEC circuit is implemented as a hardwired, or hardened, circuit block within the IC. The SD-FEC circuit is software programmable to decode data using any of a variety of different techniques and/or code types. In particular embodiments, the SD-FEC circuit is software programmable to encode data using any of a variety of different techniques and/or code types. As such, the SD-FEC circuit may be used in a variety of different applications. The inner transceiver, being implemented using programmable circuitry of the IC, is highly configurable to implement different circuit architectures around the SD-FEC circuit(s) depending upon the particular application in which the software defined modem is to be used.

By coupling the hardwired outer transceiver with an inner transceiver implemented in programmable circuitry, a highly configurable software defined modem is implemented. The software defined modem can be configured for use in a wide range of applications. For example, a software defined modem implemented as described within this disclosure can be used to implement a cable modem capable of carrying television signals and/or broadband in accordance with the Data Over Cable Service Interface Specification (DOCSIS) 3.0 and/or 3.1 standards, a wireless mobile broadband modem that is capable of operating at microwave frequencies (e.g., WiFi® and WiMax™), and a mobile broadband and/or wireless modem for use in mobile telephone systems within 4G LTE, 5G, and/or 5G New Radio (NR) applications including backhaul.

In one or more embodiments, the software defined modem is included in a larger system. The system may include one or more additional circuit blocks coupled to the software defined modem. In one example, an analog interface is coupled to, and used with, the software defined modem. The analog interface allows the software defined modem to capture high speed analog signals and/or output high speed analog signals. In particular embodiments, the analog interface is implemented in the same IC that implements the software defined modem. As such, the software defined modem can be included in a system or IC that provides an end-to-end solution.

The inventive arrangements described herein provide a software defined modem that is highly configurable and can be updated after release when operating in the field. The example embodiments provide an architecture for a software defined modem that can be tailored to any of a variety of different applications and/or technologies and that is updateable over time.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates a system 100 including an example software defined modem 102. A modem, or "modulator-demodulator," refers to a hardware device that modulates one or more carrier wave signals to encode digital information and demodulates such signals to decode the transmitted information.

In one or more embodiments, system 100 is implemented using a single IC. As an example, system 100 may be implemented in an IC that includes programmable circuitry such as a field programmable gate array (FPGA) or a System-on-Chip (SoC) having programmable circuitry. In one or more other embodiments, system 100 is implemented using a plurality of interconnected ICs. In that case, software defined modem 102 is implemented using a single IC having programmable circuitry.

In the example of FIG. 1, software defined modem 102 includes two different sections referred to as outer transceiver 104 and inner transceiver 106. Outer transceiver 104 includes one or more hardwired circuit blocks. For example, outer transceiver 104 includes one or more SD-FEC circuits 108. Each SD-FEC circuit 108 is software configurable to perform encoding and/or decoding using any of a variety of different code types. Examples of different code types include, but are not limited to, standards-based Low-Density Parity Check (LDPC) codes, custom LDPC codes, Polar Codes, and Turbo codes. The particular number of SD-FEC circuits 108 shown in FIG. 1 is for purposes of illustration. Some embodiments may include additional SD-FEC circuits 108, while other embodiments may include fewer SD-FEC circuits 108 than shown.

LDPC codes are a class of error-correcting codes that may be efficiently encoded and decoded in hardware. LDPC codes are linear codes that have sparse parity-check matrices. The sparseness of the parity-check matrices allows for relatively fast decoding and computationally-inexpensive error correction. Many practical LDPC code designs use quasi-cyclic (QC) LDPC codes to yield more efficient hardware parallelization. Polar codes are a class of linear block error correcting codes. Polar codes are constructed based on a multiple recursive concatenation of a short kernel code that transforms the physical channel into virtual outer channels. Both LDPC codes and Polar codes are utilized in 5G NR applications. Turbo codes are a class of high-performance forward error correction (FEC) codes. Turbo codes may be used in LTE, 4G, and certain 5G applications (e.g., in applications/networks spanning the transition from 4G to 5G).

In one or more embodiments, each SD-FEC circuit 108 is programmed to implement or use a particular code type by loading parameters that specify the particular codes to be used. In one or more embodiments, the parameters specify the code(s) as matrix definition(s) that are stored in internal memory, where the matrix definition is specific to a particular code type, particular code of that type, and, as such a particular application and type of modem. The matrix definitions are stored in random-access memory (RAM) so that the parameters may be updated during operation of software defined modem 102.

In one or more embodiments, each SD-FEC circuit 108 is capable of performing both encoding and decoding operations. The code type used may be an LDPC code, whether a standards-based LDPC code or a custom LDPC code, a Polar code, or a Turbo code. Further, the code may be a particular LDPC code selected from a plurality of different LDPC codes, a particular Polar code selected from a plurality of different Polar codes, or a Turbo code selected from a plurality of different Turbo codes.

For example, SD-FEC circuits 108 are capable of encoding received information by generating a parity part using a selected type of code and outputting codewords that include the original information and the parity parts. SD-FEC circuits 108 are capable of outputting the parity part and the information part as a codeword when encoding using LDPC codes or Turbo codes. In the case of Polar codes, SD-FEC circuits 108 are capable of outputting a codeword that is a completely transformed, e.g., encoded, version of the input that does not include the original information (e.g., where the input information is not in the resulting codeword in unencoded form).

Each SD-FEC circuit 108 is further capable of decoding encoded data using a selected type of code. The code type used may be an LDPC code, whether a standards-based LDPC code or a custom LDPC code, a Polar code, or a Turbo code. Further, the code may be a particular LDPC code selected from a plurality of LDPC codes, a particular Polar code selected from a plurality of Polar codes, or a particular Turbo code selected from a plurality of Turbo codes.

In particular embodiments, one or more SD-FEC circuits 108 are capable of performing encoding while one or more other SD-FEC circuits 108 are capable of performing decoding. In other embodiments, one or more SD-FEC circuits 108 include both encoding and decoding circuitry, each being programmable with particular codes of a selected type.

In one or more other embodiments, an SD-FEC circuit 108 may be dedicated to performing decoding while one or more other circuits are used to perform encoding. In some embodiments, one or more of the encoding circuits are implemented as further hardwired circuit blocks within outer transceiver 104 (not shown) that are dedicated to performing encoding. In other embodiments, one or more of the encoding circuits are implemented using the programmable circuitry of the IC and are coupled to the inner transceiver 106 and to any other circuitry that couples to outer transceiver 104. In some embodiments, where encoding is performed by encoder(s) implemented in programmable circuitry, outer transceiver 104 is hardwired to support decoding and may not support encoding.

SD-FEC circuit 108 is capable of correcting errors in a digital transmission through a noisy channel by incorporating redundancy in the digital transmission. SD-FEC circuit 108 is capable of using a reduced amount of redundancy by implementing a soft-decision decoder. A soft decision decoder uses a multi-bit representation of a likelihood that a bit is a 1 or a 0. In one or more embodiments, SD-FEC circuit 108 is capable of implementing a software programmable Turbo processing circuit capable of performing Turbo decoding and/or Turbo encoding using a Turbo code currently used by LTE, 4G, and/or 5G networks. In one or more other embodiments, SD-FEC circuit 108 is capable of implementing a software programmable LDPC processing circuit capable of performing LDPC decoding and/or LDPC encoding. In one or more other embodiments, SD-FEC circuit 108 is capable of implementing a software programmable Polar processing circuit capable of performing encoding and/or decoding using Polar codes.

In particular embodiments, SD-FEC circuit 108 is capable of switching between performing Turbo decoding and/or Turbo encoding, LDPC encoding and/or LDPC decoding, and Polar encoding and/or Polar decoding based upon programmable register settings contained therein. In particular embodiments, within SD-FEC circuit 108, memory that is used to store codes, whether LDPC, Polar, or Turbo codes, may be shared among the various encode/decode circuits contained therein. In some embodiments, each code processing circuit may have dedicated memory for storing codes.

In one or more embodiments, outer transceiver 104 includes a log-likelihood ratio (LLR) circuit (not shown). The LLR circuit is capable of converting I/Q samples (e.g., constellations) into LLRs that indicate reliability of the interpretations of the bits given the I/Q samples. I/Q data refers to data that shows the changes in magnitude (or amplitude) and phase of a sine wave. The output from the LLR circuit can be provided to SD-FEC circuit 108 for use in performing the soft decision, forward error correction.

Inner transceiver 106 is implemented using programmable circuitry of the IC and couples to outer transceiver 104. The programmable circuitry is configured to implement one or more different circuit architectures that support operation of outer transceiver 104. In one or more embodiments, inner transceiver 106 implements modulation and demodulation circuits. In one or more other embodiments, inner transceiver 106 implements orthogonal frequency division multiplexing (OFDM) circuits. In still other embodiments, inner transceiver 106 implements time division multiple access (TDMA) and/or advanced-TDMA (A-TDMA) circuits.

System 100 optionally includes an analog interface 110. Analog interface 110 includes a digital-to-analog converter (DAC) 112 and an analog-to-digital converter (ADC) 114. DAC 112 is capable of receiving a multi-bit digital signal and generating an analog output based on the digital signal. ADC 114 is capable of receiving an analog input signal and generating multi-bit, digital output signal based on the analog input signal. Both DAC 112 and ADC 114 are capable of operating with a bit-width selected from a plurality of allowable bit-widths. The bit-widths are configurable (e.g., software programmable). Further, each of DAC 112 and ADC 114 is configurable to operate at a particular sample rate selected from a range of allowable sample rates. In particular embodiments, analog interface 110 is implemented as a radio frequency (RF) converter subsystem. In that case, DAC 112 is implemented as an RF-DAC; and, ADC 114 is implemented as an RF-ADC. For purposes of illustration, analog interface 110 is shown with one DAC 112 and one ADC 114. In one or more other embodiments, analog interface 110 includes a plurality of DACs 112 and a plurality of ADCs 114, where each of DACs (or RF-DACs) 112 and each of ADCs (RF-ADCs) 114 is independently configurable. On the left side (not shown), analog interface 110 can couple to an RF front end circuit.

System 100 can include a digital front end (DFE) 116. DFE 116 is coupled to analog interface 110 and to inner transceiver 106. In one or more embodiments, DFE 116 includes a serializer/deserializer (SERDES) to connect analog interface 110 to inner transceiver 106. DFE 116 may also perform one or more signal processing functions on data received from analog interface 110 and on data sent to analog interface 110. For example, DFE 116 is capable of performing functions including, but not limited to, digital predistortion (DPD), digital up converting, and/or digital down converting.

System 100 further can include a higher layer processing circuit (HLP) 118. In the example of FIG. 1, HLP 118 is coupled to outer transceiver 104. On the right (not shown), HLP 118 is capable of connecting to a network. In one or more embodiments, HLP 118 is circuitry that implements one or more upper layers of the Open System Interconnection (OSI) model. For example, HLP 118 is capable of implementing the session, transport, and network layers of the OSI model.

Figure 2A:
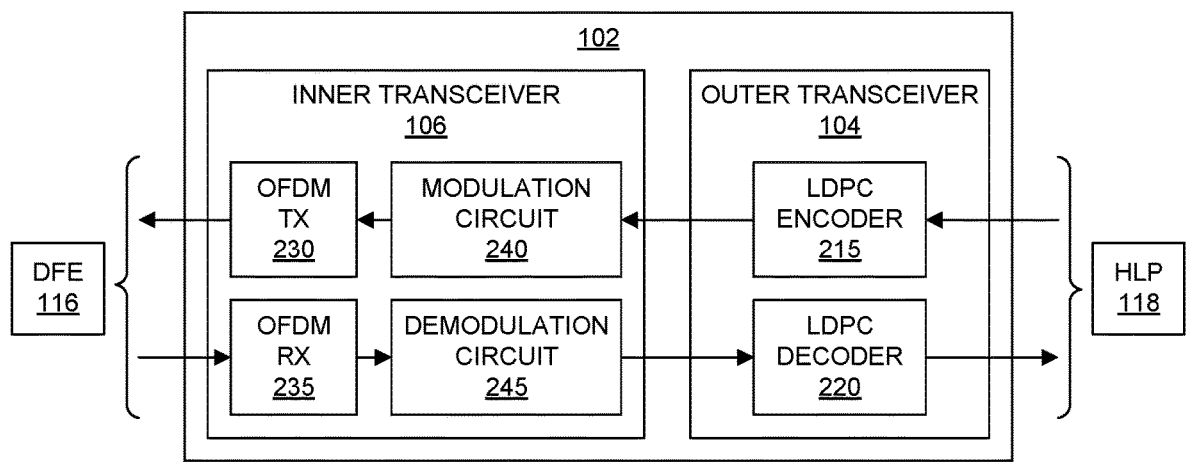
FIGS. 2A, 2B, and 2C illustrate example implementations of software defined modems.
Figure 2B:
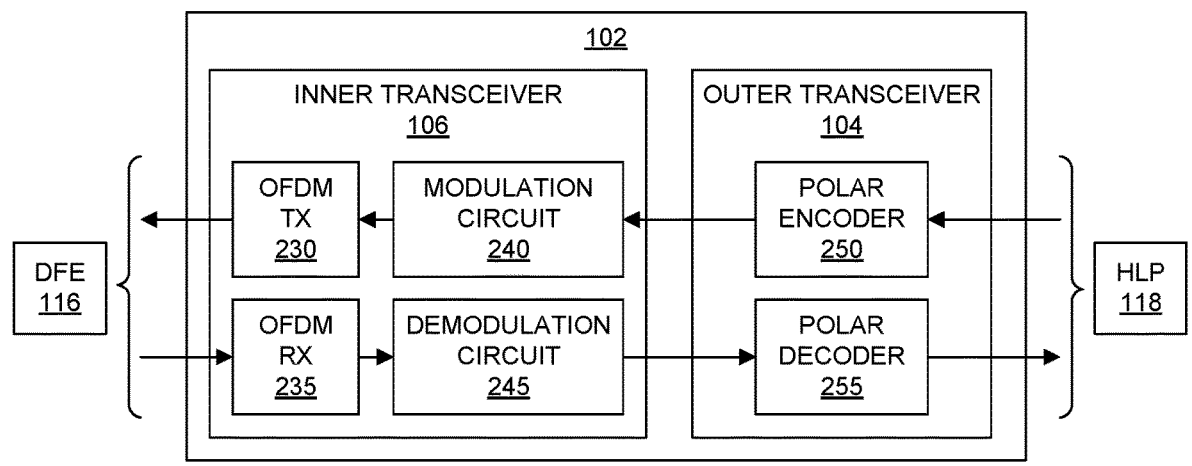
Figure 2C:
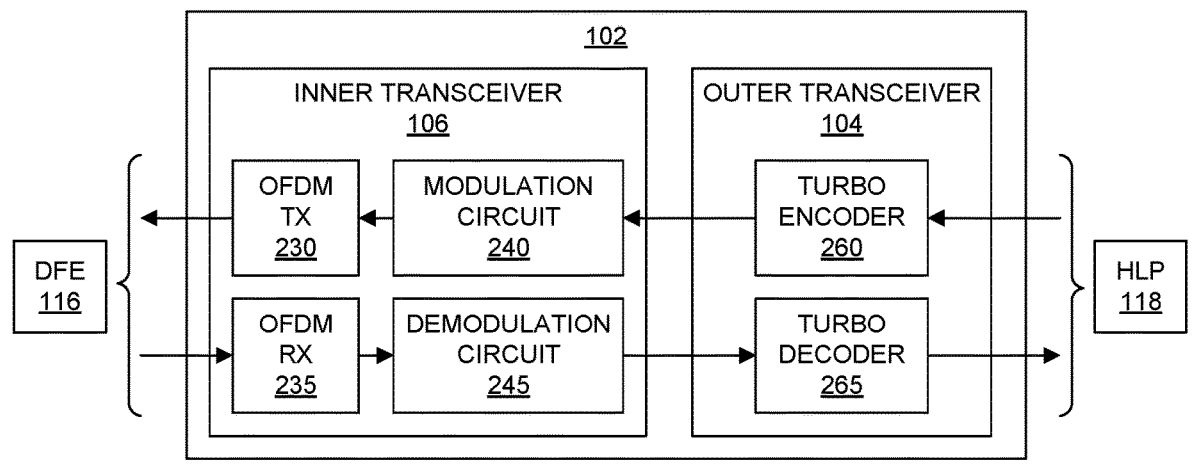

FIGS. 2A, 2B, and 2C illustrate example implementations of software defined modem 102. In one or more embodiments, software defined modem 102 is incorporated into a system such as system 100 described in connection with FIG. 1. In the example of FIGS. 2A and 2B, software defined modem 102 is configured for operation within a 5G NR enabled system. In the example of FIG. 2C, software defined modem 102 is configured for use with LTE, 4G, and 5G enabled systems.

In the example of FIG. 2A, software defined modem 102 is implemented substantially as described in connection with FIG. 1. Outer transceiver 104 is implemented using one or more hardwired circuit blocks illustrated as LDPC encoder 215 and LDPC decoder 220. In one or more embodiments, LDPC encoder 215 is implemented using an SD-FEC circuit 108, while LDPC decoder 220 is implemented using another SD-FEC circuit 108. Each SD-FEC circuit 108 is programmed with 5G NR compatible LDPC codes. In one or more other embodiments, both LDPC encoder 215 and LDPC decoder 220 are implemented using a single SD-FEC circuit 108 that is capable of performing both encoding and decoding. In one or more other embodiments, an SD-FEC circuit 108 may be dedicated to performing decoding, e.g., implement LDPC decoder 220, while one or more other circuits, e.g., hardwired circuits implemented in outer transceiver 104, are dedicated to performing encoding, e.g., implement LDPC encoder 215.

In still other embodiments, LDPC encoder 215 may be implemented in programmable circuitry. In such an embodiment, outer transceiver 104 may include hardwired circuit blocks that are only capable of performing decoding operations, while encoding operations are implemented in the programmable circuitry. In particular embodiments, the circuit block(s) configured for performing encoding are included in inner transceiver 106.

Inner transceiver 106 is implemented using programmable circuitry of the IC used to implement software defined modem 102. In the example of FIG. 2A, inner transceiver 106 includes OFDM transmitter (TX) 230, OFDM receiver (RX) 235, modulation circuit 240, and demodulation circuit 245.

Being configured for use with 5G NR, LDPC encoder 215 and LDPC decoder 220 are capable of using LDPC codes that are compatible with 5G NR. As illustrated, LDPC encoder 215 receives data, e.g., unencoded information, from HLP 118, encodes the data using a selected LDPC code to generate parity parts, and provides the encoded data (e.g., codewords) to modulation circuit 240. Modulation circuit 240 modulates the received encoded data and provides the modulated data to OFDM transmitter 230.

OFDM transmitter 230 is capable of generating constellations from the received data where each constellation includes multiple samples of I/Q data. For example, OFDM transmitter 230 is capable of taking a received signal from modulation circuit 240 and splitting the signal into N frequencies. Each frequency carries data over time. The result of processing by OFDM transmitter 230 can be represented as a 2-dimensional grid with frequency on one axis and time on the other axis. Each box in the grid corresponds to a sample of the constellation. The sample is I/Q data that represents and, therefore, can be translated into, multiple bits.

OFDM transmitter 230 outputs the generated constellations to DFE 116. In one or more embodiments, DFE 116 and OFDM transmitter 230 communicate using Common Public Radio Interface (CPRI™). The CPRI specification defines a flexible interface for radio base stations between the radio equipment control and the radio equipment.

OFDM receiver 235 is capable of receiving constellations and translating the samples of the constellations into data bits. OFDM receiver 235 provides the data bits to demodulation circuit 245. Demodulation circuit 245 demodulates the received data and provides the demodulated data, which is encoded data or codewords, to LDPC decoder 220. LDPC decoder 220 is capable of determining the parity parts from the codewords and performing soft-decision, forward error correction on the information parts of the codewords using LDPC codes compatible with 5G NR and the parity parts. The forward error corrected information or codeword is output from LDPC decoder 220 to HLP 118.

In the example of FIG. 2B, software defined modem 102 is implemented substantially as described in connection with FIG. 1 and FIG. 2A. As such, certain blocks illustrated in FIG. 2A are not described again in connection with FIG. 2B. Outer transceiver 104 is implemented using one or more hardwired circuit blocks illustrated as Polar encoder 250 and Polar decoder 255. In one or more embodiments, Polar encoder 250 is implemented using an SD-FEC circuit 108, while Polar decoder 255 is implemented using another SD-FEC circuit 108. Each SD-FEC circuit 108 is programmed with 5G NR compatible Polar codes. In one or more other embodiments, both Polar encoder 250 and Polar decoder 255 are implemented using a single SD-FEC circuit 108 that is capable of performing both encoding and decoding. In one or more other embodiments, an SD-FEC circuit 108 may be dedicated to performing decoding, e.g., implement Polar decoder 255, while one or more other circuits, e.g., hardwired circuits implemented in outer transceiver 104, are dedicated to performing encoding, e.g., implement Polar encoder 250.

In still other embodiments, Polar encoder 250 may be implemented in programmable circuitry. In such an embodiment, outer transceiver 104 may include hardwired circuit blocks that are only capable of performing decoding operations, while encoding operations are implemented in the programmable circuitry. In particular embodiments, the circuit block(s) configured for performing encoding are included in inner transceiver 106.

Being configured for use with 5G NR, Polar encoder 250 and Polar decoder 255 are capable of using Polar codes that are compatible with 5G NR. As illustrated, Polar encoder 250 receives data, e.g., unencoded information, from HLP 118, encodes the data using a selected Polar code to generate codewords, and provides the encoded data (e.g., codewords) to modulation circuit 240. Modulation circuit 240 modulates the received encoded data and provides the modulated data to OFDM transmitter 230.

Polar decoder 255 is capable of determining the originally encoded information from a received codeword. Polar decoder 255 is further capable of correcting one or more errors in the decoding process. The resulting decoded and error-corrected information is output from Polar decoder 255 to HLP 118.

In the example of FIG. 2C, software defined modem 102 is implemented substantially as described in connection with FIG. 1 and FIG. 2A. As such, certain blocks illustrated in FIG. 2A are not described again in connection with FIG. 2C. Outer transceiver 104 is implemented using one or more hardwired circuit blocks illustrated as Turbo encoder 260 and Turbo decoder 265. In one or more embodiments, Turbo encoder 260 is implemented using an SD-FEC circuit 108, while Turbo decoder 265 is implemented using another SD-FEC circuit 108. Each SD-FEC circuit 108 is programmed with LTE, 4G, and/or 5G compatible Turbo codes. In one or more other embodiments, both Turbo encoder 260 and Turbo decoder 265 are implemented using a single SD-FEC circuit 108 that is capable of performing both encoding and decoding. In one or more other embodiments, an SD-FEC circuit 108 may be dedicated to performing decoding, e.g., implement Turbo decoder 265, while one or more other circuits, e.g., hardwired circuits implemented in outer transceiver 104, are dedicated to performing encoding, e.g., implement Turbo encoder 260.

In still other embodiments, Turbo encoder 260 may be implemented in programmable circuitry. In such an embodiment, outer transceiver 104 includes hardwired circuit blocks that are only capable of performing decoding operations, while encoding operations are implemented in the programmable circuitry. In particular embodiments, the circuit block(s) configured for performing encoding are included in inner transceiver 106.

Being configured for use with LTE, 4G, and selected 5G applications, Turbo encoder 260 and Turbo decoder 265 are capable of using Turbo codes that are compatible with LTE, 4G, or 5G, respectively. As illustrated, Turbo encoder 260 receives data, e.g., unencoded information, from HLP 118, encodes the data using a selected Turbo code to generate parity parts, and provides the encoded data (e.g., codewords) to modulation circuit 240. Modulation circuit 240 modulates the received encoded data and provides the modulated data to OFDM transmitter 230.

Turbo decoder 265 is capable of determining the parity parts from the codewords received from demodulation circuit 245 and performing soft-decision, forward error correction on the information parts of the codewords using Turbo codes compatible with the relevant standard and the parity parts. The forward error corrected information or codeword is output from Turbo decoder 265 to HLP 118.

Figure 3:
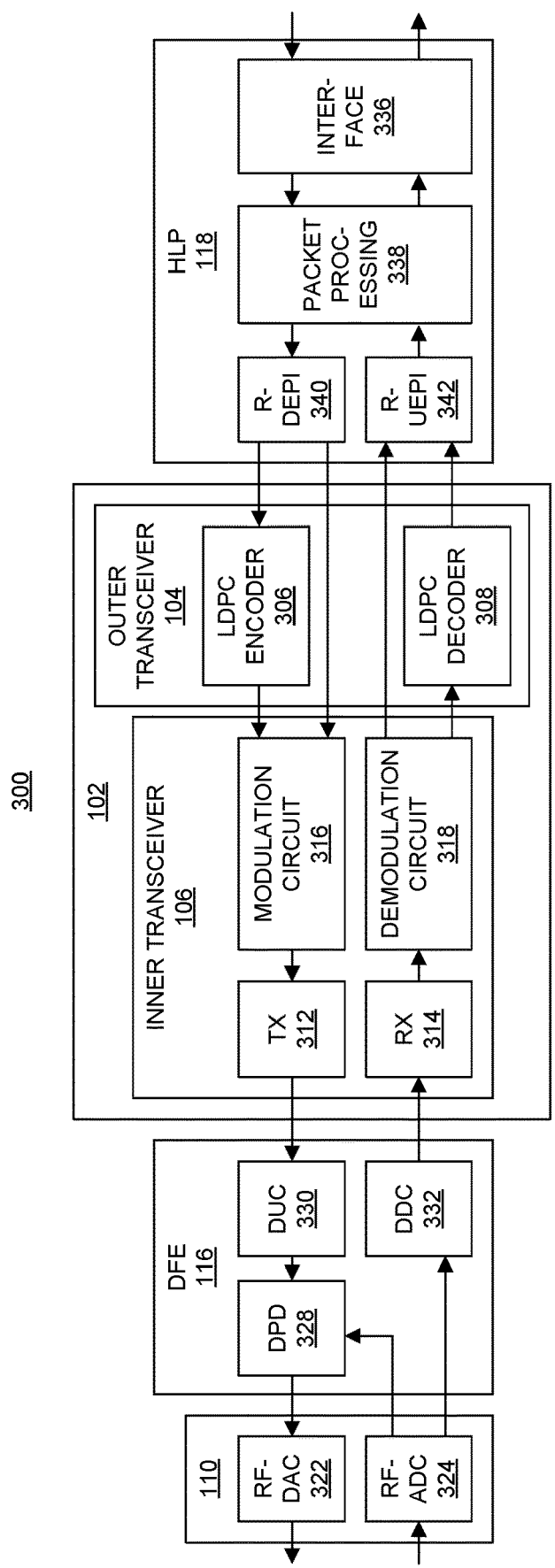
FIG. 3 illustrates a system including another example implementation of a software defined modem.

FIG. 3 illustrates a system 300 including another example implementation of software defined modem 102. In the example of FIG. 3, software defined modem 102 is implemented as a cable modem. In one or more embodiments, system 300 is configured for operation in accordance with the DOCSIS 3.1 standard. In one or more other embodiments, system 300 is configured for operation in accordance with the DOCSIS 3.0 standard.

In one or more embodiments, system 300 is implemented using a single IC. As an example, system 300 may be implemented in an FPGA or in an SoC having programmable circuitry. In one or more other embodiments, system 300 is implemented using a plurality of ICs. In the latter case, software defined modem 102 still may be implemented using a single IC.

Software defined modem 102 is implemented substantially as described in connection with FIG. 1. Outer transceiver 104 is implemented using one or more hardwired circuit blocks illustrated as LDPC encoder 306 and LDPC decoder 308. In one or more embodiments, LDPC encoder 308 is implemented using an SD-FEC circuit 108, while LDPC decoder 308 is implemented using another SD-FEC circuit 108. Each SD-FEC circuit 108 is programmed with DOCSIS 3.1 or DOCSIS 3.0 compatible LDPC codes. In one or more other embodiments, both LDPC encoder 306 and LDPC decoder 308 are implemented using a single SD-FEC circuit 108 that is capable of performing both encoding and decoding. In one or more other embodiments, an SD-FEC circuit 108 may be dedicated to performing decoding, e.g., implement LDPC decoder 308, while one or more other circuits, e.g., hardwired circuits implemented in outer transceiver 104, are dedicated to performing encoding, e.g., implement LDPC encoder 306.

In still other embodiments, LDPC encoder 306 may be implemented in programmable circuitry. In such an embodiment, outer transceiver 104 may include hardwired circuit blocks that are only capable of performing decoding operations, while encoding operations are implemented in the programmable circuitry. In particular embodiments, the circuit block(s) configured for performing encoding are included in inner transceiver 106.

Inner transceiver 106 is implemented using programmable circuitry. In the example of FIG. 3, inner transceiver 106 includes transmitter 312, receiver 314, modulation circuit 316, and demodulation circuit 318.

In embodiments where software defined modem 102 is configured for use with DOCSIS 3.1, LDPC encoder 306 and LDPC decoder 308 use LDPC codes that are compatible with DOCSIS 3.1. In embodiments where software defined modem 102 is configured for use with DOCSIS 3.0, LDPC encoder 306 and LDPC decoder 308 use LDPC codes that are compatible with DOCSIS 3.0. As illustrated, LDPC encoder 306 receives data from HLP 118, encodes the data using the LDPC codes to generate a parity part, and provides the codewords, in reference to the information part and the parity part, to modulation circuit 316. Modulation circuit 316 modulates the codewords and provides the modulated data to transmitter 312. In one or more embodiments, transmitter 312 includes an OFDM transmitter and/or a TDMA transmitter (whether TMDA or A-TDMA). The particular type of transmitter 312 included may vary based upon whether software defined modem 102 is compatible with DOCSIS 3.1 or DOCSIS 3.0. Transmitter 312 outputs the data to DFE 116.

Receiver 314 is capable of receiving signals and converting the received signals into data bits (e.g., codewords). In one or more embodiments, receiver 314 includes an OFDM receiver and/or a TDMA receiver. The particular type of receiver 314 included may vary based upon whether software defined modem 102 is compatible with DOCSIS 3.1 or DOCSIS 3.0. Receiver 314 provides the data bits to demodulation circuit 318. Demodulation circuit 318 demodulates the received data and provides the demodulated data, which is encoded, to LDPC decoder 308. LDPC decoder 308 is capable of determining the parity part from the information part and performing soft-decision, forward error correction on the information part using LDPC codes compatible with DOCSIS 3.1 or DOCSIS 3.0 and the parity part. The forward error corrected data is output from LDPC decoder 308 to HLP 118. LDPC decoder 308 may output error corrected codewords or the information part of the codewords.

In the example of FIG. 3, system 300 includes analog interface 110. Analog interface 110 includes an RF-DAC 322 and an RF-ADC 324. Each of RF-DAC 322 and RF-ADC 324 is configurable to operate as generally described in connection with DAC 112 and ADC 114, respectively, of FIG. 1, albeit at RF frequencies. Analog interface 110 generally connects with an RF front end (not shown). Signals from the RF front end are provided to RF-ADC 324, which digitizes the received analog signals and outputs a band-limited digitized signal. RF-DAC 322 converts received digital signals to analog signals and forwards the analog signals to the RF front end for transmission.

DFE 116 is connected to analog interface 110. In the example of FIG. 3, digital down converter (DDC) 332 receives the digital output signal from RF-ADC 324. DDC 332 is capable of converting the digitized signal from RF-ADC 324 to a lower frequency signal at a lower sampling rate. Digital up converter (DUC) 330 receives the output signal generated by transmitter 312. DUC 330 is capable of increasing the sample rate of the signal received from transmitter 312 and providing the resulting signal to digital predistortion (DPD) circuit 328. DPD circuit 328 processes the received signal by negating non-linear effects of a power amplifier. The output from DPD circuit 328 is provided to RF-DAC 322. As shown, from RF-ADC 324 also provides a digital output signal to DPD 328 for processing to evaluate the non-linear behavior of the power amplifier.

HLP 118 is coupled to outer transceiver 104. On the right (not shown), HLP 118 is capable of connecting to a network. In the example of FIG. 3, HLP 118 includes an interface 336 coupled to packet processing circuit 338. In one or more embodiments, interface 336 is implemented as an Ethernet interface. In one example, interface 336 is implemented as a 10 Gigabit Ethernet interface. Packet processing circuit 338 is connected to a remote downstream external PHY interface (R-DEPI) 340 and a remote upstream external PHY interface (R-UEPI) 342. In one or more embodiments, R-DEPI 340 is compliant with the Remote Downstream External PHY Interface specification and R-UEDI 342 is compliant with the Remote Upstream External PHY Interface specification. As illustrated, R-DEPI 340 is connected to both LDPC encoder 306 and to modulation circuit 316. R-DEPI 340 provides an output signal to each of LDCP encoder 306 and to modulation circuit 316. R-UEPI 342 is connected to demodulation circuit 318 and to LDPC decoder 308. R-UEPI 342 receives input signals from each of demodulation circuit 318 and LDPC decoder 308.

Figure 4:
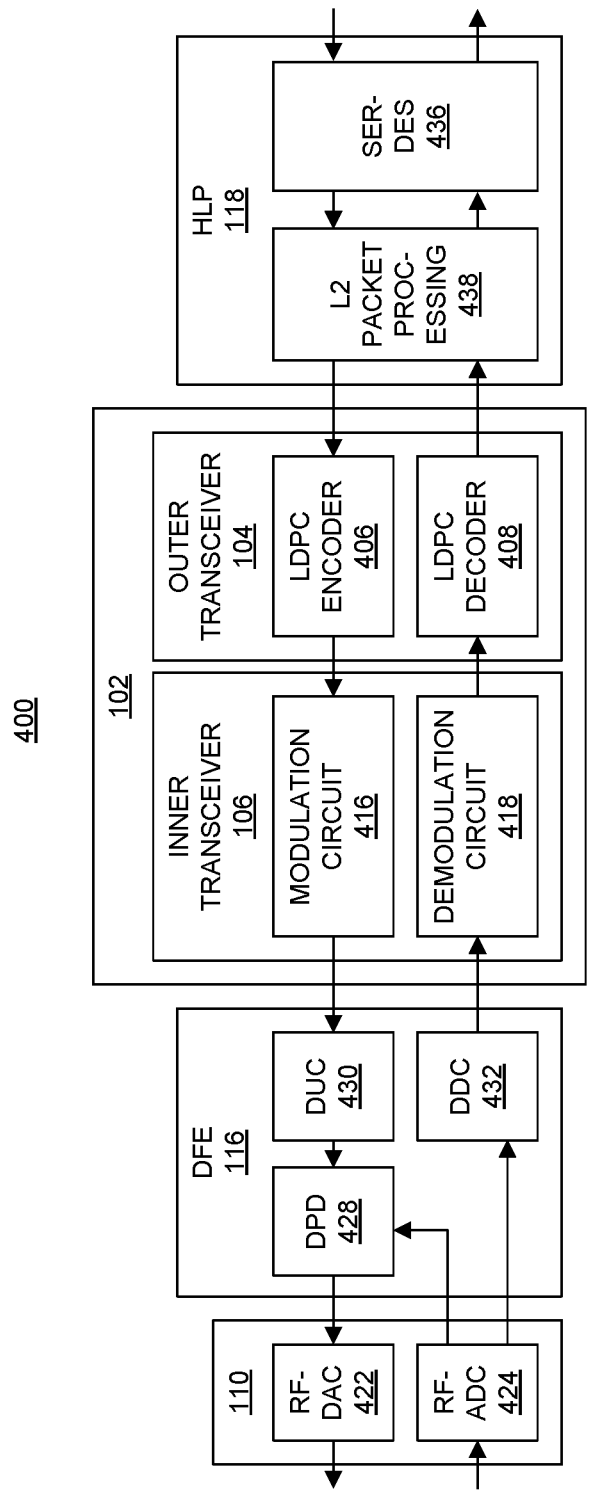
FIG. 4 illustrates a system including another example implementation of a software defined modem.

FIG. 4 illustrates a system 400 including another example implementation of software defined modem 102. In the example of FIG. 4, software defined modem 102 is implemented as a backhaul modem as used within wireless applications.

In one or more embodiments, system 400 is implemented using a single IC. As illustrative examples, system 400 can be implemented in an FPGA or in an SoC having programmable circuitry. In one or more other embodiments, system 400 is implemented using a plurality of ICs. In the latter case, software defined modem 102 may be implemented in a single IC.

Software defined modem 102 is implemented substantially as described in connection with FIG. 1. Outer transceiver 104 is implemented using one or more hardwired circuit blocks illustrated as LDPC encoder 406 and LDPC decoder 408. In one or more embodiments, LDPC encoder 406 is implemented using an SD-FEC circuit 108, while LDPC decoder 408 is implemented using another SD-FEC circuit 108. In one or more other embodiments, both LDPC encoder 406 and LDPC decoder 408 are implemented using a single SD-FEC circuit 108 that is capable of performing both encoding and decoding. In one or more other embodiments, an SD-FEC circuit 108 may be dedicated to performing decoding, e.g., implement LDPC decoder 408, while one or more other circuits, e.g., hardwired circuits implemented in outer transceiver 104, are dedicated to performing encoding, e.g., implement LDPC encoder 406.

In still other embodiments, LDPC encoder 406 may be implemented in programmable circuitry. In such an embodiment, outer transceiver 104 may include hardwired circuit blocks that are only capable of performing decoding operations, while encoding operations are implemented in the programmable circuitry. In particular embodiments, the circuit block(s) configured for performing encoding are included in inner transceiver 106.

Being configured for use with backhaul mobile applications, LDPC encoder 406 and LDPC decoder 408 use custom LDPC codes. In the case of backhaul applications, the LDPC codes are nonstandard and vendor specific.

As illustrated, LDPC encoder 406 receives data from HLP 118, encodes the data using the customized LDPC codes to generate a parity part and provides the encoded data, e.g., codewords including the information part and the parity part, to modulation circuit 416. Modulation circuit 416 modulates the encoded data and provides the modulated data to DFE 116. DFE 116 and analog interface 110 are implemented substantially as described in connection with FIG. 3. As pictured, analog interface 110 includes RF-DAC 422 and RF-ADC 424. DFE 116 includes DPD 428, DUC 430, and DDC 432. In the example of FIG. 4, analog interface 110 and DFE 116 are configured for operation within a backhaul application.

In the example of FIG. 4, demodulation circuit 418 receives data from DDC 432. Demodulation circuit 418 demodulates the received data and provides the demodulated data, which is encoded, to LDPC decoder 408. LDPC decoder 408 is capable of determining the parity part from the codewords and performing soft-decision, forward error correction on the information part using the custom LDPC codes and the parity part. The forward error corrected data is output from LDPC decoder 408 to HLP 118. LDPC decoder 408 is capable of outputting the error corrected information part or the error corrected codeword.

HLP 118 is coupled to outer transceiver 104. On the right (not shown), HLP 118 is capable of connecting to a network. In the example of FIG. 4, HLP 118 includes a SERDES 436 and an L2 packet processing circuit 438. As illustrated, L2 packet processing circuit 438 is connected to both LDPC encoder 406 and to LDPC decoder 408.

Figure 5A:
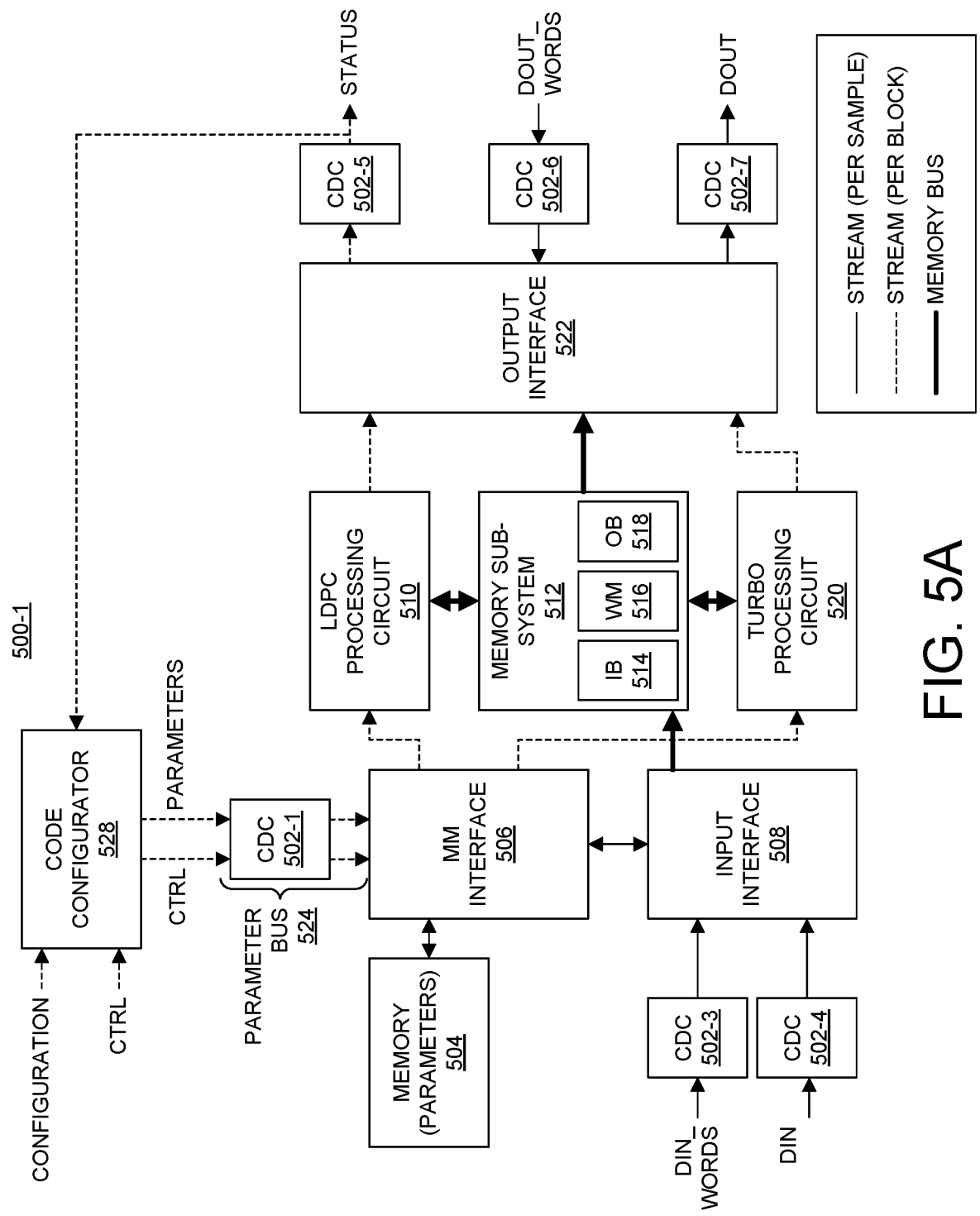
FIGS. 5A, 5B, and 5C illustrate example architectures for a soft-decision forward error correction (SD-FEC) circuit.
Figure 5B:
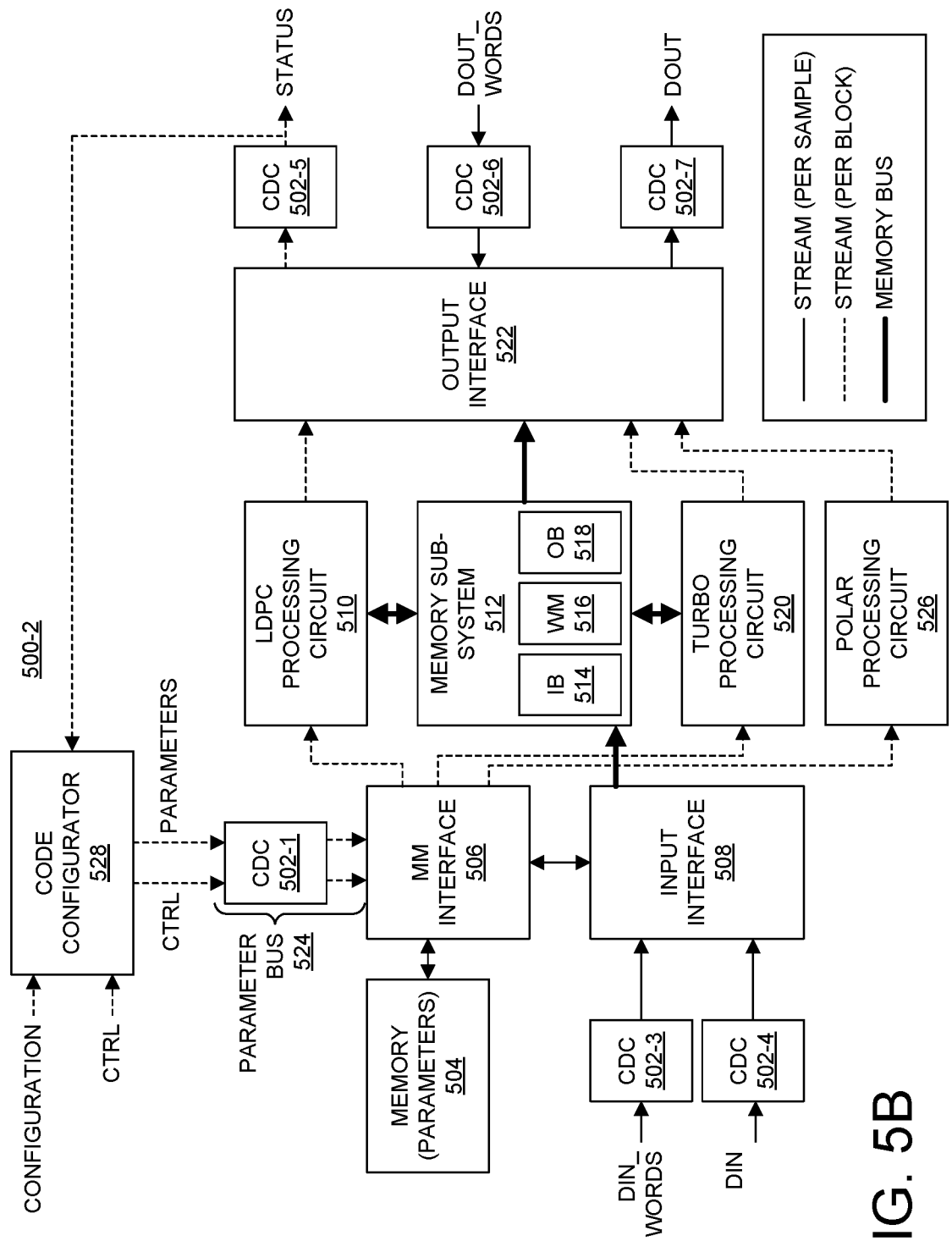
Figure 5C:
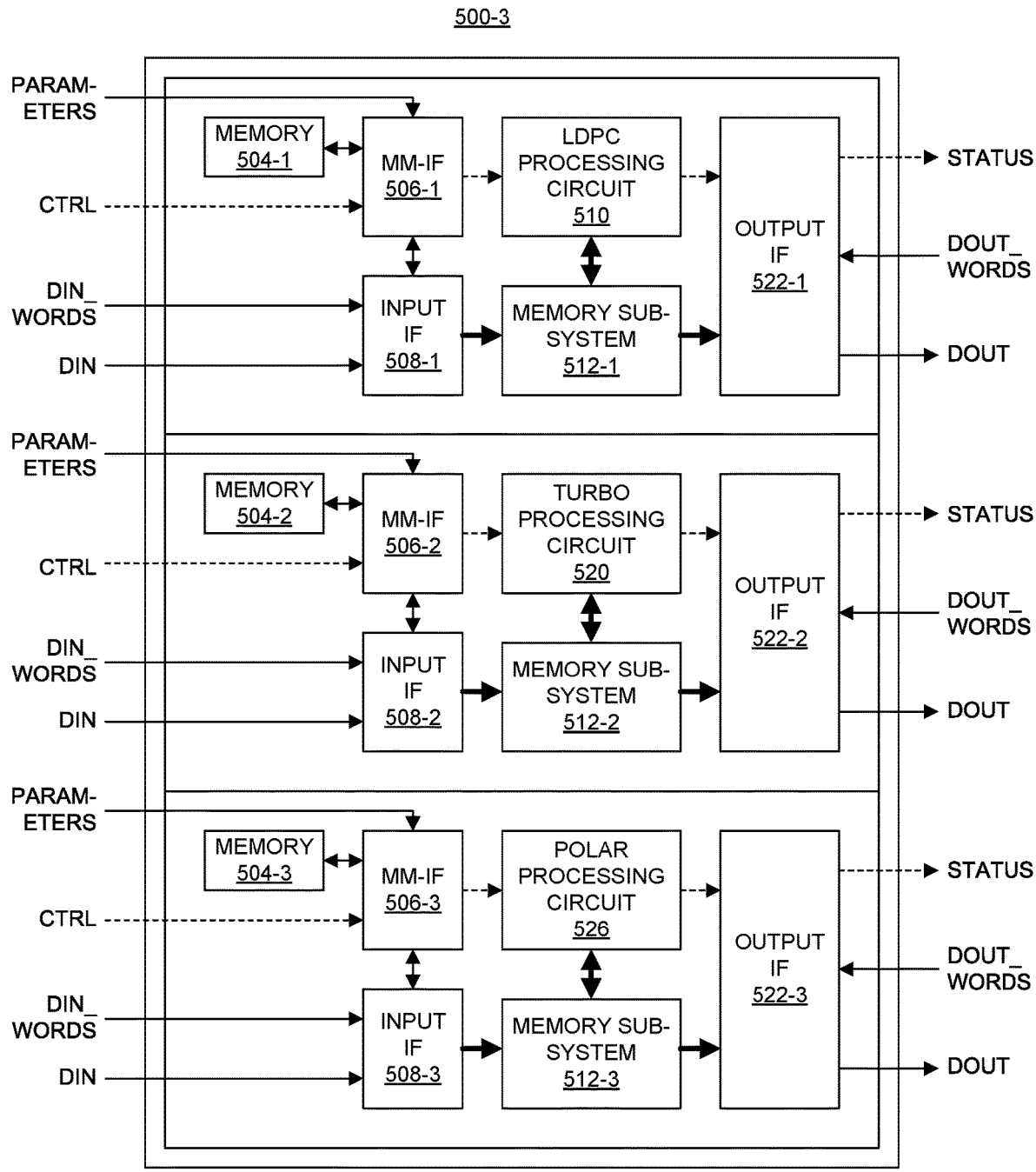

FIGS. 5A, 5B, and 5C illustrate example architectures for an SD-FEC circuit. FIG. 5A illustrates an example architecture 500-1 that may be used to implement an SD-FEC circuit 108. Architecture 500-1 includes a plurality of clock domain crossing (CDC) circuits 502. Inclusion of CDC circuits 502 allows architecture 500-1 to operate at a different clock rate than the surrounding circuitry (e.g., the surrounding programmable circuitry). In one or more embodiments, architecture 500-1 operates on a separate clock than the programmable circuitry used to implement the inner-transceiver. The clock for architecture 500-1, for example, is capable of running at a higher frequency than the clock for the programmable circuitry of the IC that is used to clock the inner transceiver. In one or more other embodiments, CDC circuits 502 can be omitted in the case where architecture 500-1 is clocked at a same frequency as the programmable circuitry and the inner transceiver.

In some embodiments, CDC circuits 502 are also capable of performing width conversion. CDC circuits 502 such as, for example, CDC circuits 502-1, 502-3, and/or 504-4, are capable of decreasing the width of received signals by a particular factor. As an example, the factor may be 2 or 4 (decreasing width from 512-bits to 256-bits or 128-bits) since architecture 500-1 is capable of operating at a faster clock speed than the circuitry coupled to architecture 500-1 beyond the boundary formed by CDC circuits 502. CDC circuits 502 such as, for example, CDC circuits 502-5, 502-6, and/or 502-7, are capable of increasing the width of received signals by a particular factor. The factor may be 2 or 4 and may match the factor used to decrease the width of the signals, but further may depend upon the particular clock domains that couple to inputs and outputs of architecture 500-1. The increased width of signals accounts for the decrease in clock frequency once the boundary formed by CDC circuits 502 is crossed. The width conversion performed by the CDC circuits 502 allows circuitry external to architecture 500-1 with a slower speed clock to keep up with architecture 500-1 having a higher speed clock.

In the example of FIG. 5A, input interface 508 is implemented as a streaming interface. An example of a streaming interface is a stream-enabled on-chip interconnect such as an Advanced Microcontroller Bus Architecture (AMBA®) Advanced Extensible Interface (AXI) stream interconnect. An AXI-stream interconnect enables connection of heterogeneous master/slave AMBA® AXI-stream protocol compliant circuit blocks. Input interface 508 is capable of routing received data, e.g., data received via the DIN signal, to memory subsystem 512. AXI is provided for purposes of illustration and is not intended to be limiting. Other suitable interconnects, protocols, and/or buses may also be used.

The DIN signal provided to input interface 508 provides the streamed data to be processed. In one example, DIN has a width of 512 bits. In one or more embodiments, the DIN_WORDS signal specifies the number of bits of DIN, e.g., a bit-width, that is processed on each clock cycle. Blocks of data can be transferred over a plurality of clock cycles. For each input on DIN, input interface 508 receives a DIN_WORDS value specifying the number of bits to be processed out of the total number of possible bits (e.g., out of 512). In one or more other embodiments, the DIN_WORDS signal is specified on a per block basis.

MM interface 506 is coupled to memory 504 and to input interface 508. In one or more embodiments, MM interface 506 is implemented as an AXI MM interface. Memory 504 is configured to store one or more parameters for architecture 500-1. The parameters can include, or specify, one or more different LDPC codes and/or one or more Turbo codes that can be used for purposes of encoding and/or decoding as indicated by a CTRL signal received by architecture 500-1. In particular embodiments, the codes can be stored in memory 504 as matrix definitions. In the example of FIG. 5A, MM interface 506 is connected to a parameter bus 524.

In one or more embodiments, memory 504 is capable of storing one or more different codes concurrently. The one or more different codes may be of one or more different code types. For example, while memory 504 may store multiple different LDPC codes and/or multiple different Turbo codes, memory 504 may also store one or more of each of LDPC codes (whether standardized and/or custom) and/or one or more Turbo codes concurrently. As such, memory 504 may be shared among the different processing circuits (e.g., encoder and/or decoder circuits) included in architecture 500-1. Sharing memory 504 among the processing circuits reduces the cost of implementation of circuitry that is capable performing different types of decoding and/or encoding.

Parameter bus 524 is capable of providing the CTRL signal and the parameters signal specifying one or more parameters for codes to be used by SD-FEC circuit 108. MM interface 506 stores the parameters in memory 504. Using parameter bus 524, different LDPC codes and/or Turbo codes can be downloaded for storage in memory 504 prior to operating architecture 500-1 or at runtime, e.g., during operation of architecture 500-1.

In one or more embodiments, parameter bus 524 is implemented as an AXI-Lite interface. For example, parameter bus 524, when implemented using AXI-Lite, is capable of providing point-to-point bidirectional communication with another circuit block from which the parameters and/or CTRL signal are provided. As an illustrative and nonlimiting example, the circuit block may be a processor or a processor system capable of generating and/or providing parameters to memory 504 by way of MM interface 506. In one or more embodiments, the processor system is included in the same IC as architecture 500-1. In other embodiments, the processor system or source of the parameters may be located off-chip from architecture 500-1.

It should be appreciated that AXI is provided for purposes of illustration and not limitation. Other suitable streaming interconnects, MM interconnects, control interfaces, and/or protocols may also be used. In general, data streams are used for point-to-point communications where addressing is not used or required as is the case for memory mapped transactions.

In one or more embodiments, where the CTRL signal is provided to memory mapped (MM) interface 506 (e.g., a control input thereof) and specifies the particular codes to be used to process a block of data received on DIN. Memory 504, for example, is capable of storing one or more different LDPC codes and/or one or more different Turbo codes. For example, the CTRL signal may specify one of a plurality of LDPC codes or one of a plurality of Turbo codes stored in memory 504 to be used to process a block of data received on DIN. In one or more embodiments, for each block of data provided to input interface 508 for processing, the CTRL signal provides 32 bits of data specifying how SD-FEC circuit 108 is to process the block of data. The data provided by the CTRL signal, for example, indicates whether encoding or decoding is to be performed and the particular code, e.g., the particular LDPC code or particular Turbo code, from memory 504 to be used for the operation.

In one or more embodiments, LDPC processing circuit 510 is capable of performing encoding and decoding operations on data received via input interface 508. For example, based upon the CTRL signal, LDPC processing circuit 510 is capable of determining the specified LDPC code from memory 504 and whether the received data is to be encoded or decoded. In performing the encoding and decoding operations using the specified LDPC code, LDPC processing circuit 510 is capable of using memory subsystem 512. Data received via input interface 508 is provided to memory subsystem 512 for processing by LDPC processing circuit 510 (or Turbo processing circuit 520).

In one or more other embodiments, LDPC processing circuit 510 is capable of performing only LPDC decoding. In that case, LDPC processing circuit 510 may be capable of determining the particular LDPC code to be used for decoding from memory 504 based on the CTRL signal. LDPC processing circuit 510 decodes received codewords using the specified LDPC code.

Memory subsystem 512 includes an input buffer 514 that is capable of receiving streamed data from input interface 508, a working memory 516 that is usable by LDPC processing circuit 510 for encoding and/or decoding received data (and usable by Turbo processing circuit 520 for decoding and/or encoding received data), and an output buffer 518 that is capable of storing results of decoding and/or encoding operations.

In particular embodiments, input interface 508 is capable of routing data received via the DIN signal to one more different memories or buffers within memory subsystem 512 depending upon the type of codes to be used. For example, while memory subsystem 512 is shown to include input buffer 514, working memory 516, and an output buffer 518, in one or more other embodiments, these buffers may be duplicated so that LDPC processing circuit 510 and Turbo processing circuit 520 each has a different input buffer, a different working memory, and a different output buffer. For example, memory subsystem 512 may be partitioned or divided into a plurality of banks, where each different processing circuit has a different partition or bank. Accordingly, input interface 508 is capable of storing data received via the DIN signal to the appropriate input buffer based upon the type of code (LDPC or Turbo) that is to be used.

Output interface 522 is implemented as a streaming interface. In the example of FIG. 5A, the status signal indicates the operation performed on the data that is output from DOUT. The status signal may also specify an identifier (ID) for the data block that is output. The DOUT_WORDS signal specifies the number of bits (e.g., bit width) of DOUT that forms the output generated by architecture 500-1. For example, DOUT and DOUT_WORDS may operate similar to DIN_WORDS and DIN in that DOUT_WORDS indicates the bit width of words output from DOUT.

As discussed, turbo processing circuit 520 can be used in LTE, 4G, and 5G applications. In one or more embodiments, Turbo processing circuit 520 may be omitted from architecture 500-1. When included, architecture 500-1 is configurable to use LDPC processing circuit 510 or Turbo processing circuit 520 based upon parameters stored in memory 504. For example, one of LDPC processing circuit 510 or Turbo processing circuit 520 may be enabled based on the values store in selected locations (e.g., registers) in memory 504 at a time. In this regard, architecture 500-1 is capable of switching between different modes of operation (LDPC and Turbo) based on the value of one or more parameters stored in memory 504. Turbo processing circuit 520 is capable of accessing memory subsystem 512, e.g., input buffer 514, working memory 516, and output buffer 518 or other buffers specific to Turbo processing circuit 520, to decode and/or encode data using a selected Turbo code specified by the CTRL signal.

In the example of FIG. 5A, input interface 508, LDPC processing circuit 510, output interface 522, and Turbo processing circuit 520 are connected to memory subsystem 512 through a memory bus. In this regard, memory subsystem 512 may also be shared among the decoder/encoders included in architecture 500-1. Architecture 500-1 is capable of switching between using Turbo processing circuit 520 and LDPC processing circuit 510 via values stored in the selected locations in memory 504. Accordingly, a particular processing circuit may be enabled based on the values stored in memory 504. For the enabled processing circuit, the operation (encoding or decoding) to be performed and the particular codes to be used may be specified by the CTRL signals.

As such, architecture 500-1 is capable of switching between decoding and/or encoding using a selected LDPC code on a per data block basis. Further, architecture 500-1 is capable of applying a different LDPC code on a per data block basis for purposes of decoding and/or encoding. Architecture 500-1 is also capable of switching between performing decoding and/or encoding using a Turbo code on a per data block basis. Further, architecture 500-1 is capable of applying a different Turbo code on a per data block basis for purposes of decoding and/or encoding. In particular embodiments, however, Turbo processing circuit 520 may be configured to perform Turbo decoding only. Further, Turbo processing circuit 520 may be implemented in a manner that is not programmable, e.g., where Turbo processing circuit 520 is capable of performing Turbo decoding using a particular Turbo code (e.g., that is not changeable).

In one or more embodiments, architecture 500-1 of FIG. 5A may be implemented where the LDPC processing circuit is replaced with a Polar processing circuit capable of using different Polar codes accessed from memory 504. In particular embodiments, Turbo processing circuit 520 may be omitted so that architecture 500-1 includes only a Polar processing circuit or only LDPC processing circuit 510.

In the example of FIG. 5A, architecture 500-1 includes an optional code configurator 528. Code configurator 528 is capable of receiving a configuration describing a code (e.g., LDPC and/or Turbo). In embodiments where the code is an LDPC code, the configuration may describe a parity-check matrix for the LDPC code. For example, the configuration may describe or otherwise indicate the bit values (e.g., "1" or "0") in each column and each row of the associated parity-check matrix, as well as the number of information bits and/or parity bits in each codeword associated with the parity-check matrix. In any case, code configurator 528 is capable of generating a set of parameterized data from the received configuration and storing the parameterized data (e.g., parameters) specifying the code in memory 504 for use by LDPC processing circuit 510 or Turbo processing circuit 520.

In some aspects, the parameters provide a high-level description of the code. In the case of an LDPC code, for example, the parameters specify the associated parity-check matrix (such as codeword length, number of information bits, circulant size, number of layers, and the like). In some embodiments, code configurator 528 may reuse or update at least some of the existing parameters in memory 504 when storing parameters for a new and/or different configuration.

In one or more embodiments, code configurator 528 may generate a code index pointing to the storage location(s), in memory 504, of the code to be used to process data. The code index may be provided to circuit blocks such as LDPC processing circuit 510, Turbo processing circuit 520, and/or other processing circuits that may be included. The code index, for example, may be included in the CTRL signal output from code configurator 528 and provided to the control input of MM interface 506.

Code configurator 528, as part of the CTRL signal, may also specify a data block ID. In the example of FIG. 5A, code configurator 528 also receives the status signal. Code configurator 528 is capable of determining when a given data block is finished processing based on the ID specified in the status signal and provide a further code index and data block ID in response thereto for processing a next data block using the appropriate processing circuit.

In some embodiments, code configurator 528 is implemented as hardwired circuitry. For example, code configurator 528 is implemented as fixed circuitry that is capable of generating and/or outputting the parameters stored in memory 504 and/or outputting the code index and data block ID. In other embodiments, code configurator 528 is implemented as a processor that is configured to execute program code. Upon execution of the program code, code configurator 528 generates the parameters and/or outputs the code index and data block ID. The processor may be a hardwired processor or a soft processor, e.g., implemented in programmable circuitry of an IC. In still other embodiments, code configurator 528 is implemented using programmable circuitry albeit in a manner that is customized for generating the parameters and/or outputting the code index and data block ID (e.g., without executing program code).

In particular embodiments, code configurator 528 is capable of generating parameters in response to receiving a configuration specifying a code at a rate at which data blocks may be encoded or decoded. As such, code configurator 528 is capable of generating and storing parameters for a code in memory 504 that may be used on a data block-by-data block basis as such data blocks are processed. This allows code configurator 528 to generate parameters for use by architecture 500-1 at the same rate the parameters may be used for encoding/decoding data blocks.

Appreciably, when code configurator 528 is implemented using programmable circuitry, code configurator 528 may be updated (e.g., modified) or reimplemented dynamically in the field. Similarly, when implemented as a processor capable of executing program code, code configurator 528 may be updated by providing new program code thereto for execution. This allows code configurator 528 to be updated or adapted to new and/or different codes that may be introduced after architecture 500-1 is released and operating in the field. Code configurator 528 is capable of transforming the received configuration into a format that is usable by architecture 500-1.

FIG. 5B illustrates an example architecture 500-2 that may be used to implement an SD-FEC circuit 108. Architecture 500-2 of FIG. 5B is substantially similar to architecture 500-1 of FIG. 5A. In the example of FIG. 5B, a Polar processing circuit 526 is included that is capable of performing decoding and/or encoding using Polar codes. In the example of FIG. 5B, memory 504 is also capable of storing one or more Polar codes concurrently with other codes such as LDPC code(s) and/or Turbo code(s) as described in connection with FIG. 5A.

In one or more embodiments, code configurator 528 is optionally included in architecture 500-2. In the example of FIG. 5B, when code configurator 528 is included, code configurator 528 is further capable of generating parameters from a received configuration and storing the parameters specifying a Polar code in memory 504 for use by Polar processing circuit 526. Architecture 500-2 is capable of switching modes between using LDPC processing circuit 510, Turbo processing circuit 520, and Polar processing circuit 526 based on data stored in memory 504 (e.g., register settings).

For example, based on the data stored in memory 504, one of LDPC processing circuit 510, Turbo processing circuit 520, or Polar processing circuit 526 is enabled. The CTRL signal received by architecture 500-2 may specify whether decoding or encoding is to be performed and the particular code (e.g., particular LDPC code, Turbo code, or Polar code) to be used for the selected operation by the enabled processing circuit. The particular codes to be used and whether encoding or decoding is performed by the enabled processing circuit may be specified on a per data block basis.

In the examples of FIGS. 5A and 5B, the decoder(s)/encoder(s) of the processing circuits 510, 520, and/or 526 utilize shared memories (504 and 512), a shared input interface 508, a shared control interface (e.g., memory mapped interface 506), and a shared output interface 522.

FIG. 5C illustrates an example architecture 500-3 that may be used to implement an SD-FEC circuit 108. Architecture 500-3 of FIG. 5C generally replicates the memories, input interface, control interface, parameter bus, and output interface structures so that each different type of processing circuit has a dedicated input interface, control interface, parameter bus, output interface, and memories. In the example of FIG. 5C, each of the processing circuits (510, 520, and 526) is capable of operating in parallel using the dedicated interfaces and memory resources.

In one or more embodiments, each of the processing circuits 510, 520, and 526 is controllable to perform encoding or decoding based on the received control signals. Further, each of processing circuits 510, 520, and 526 is programmable and capable of using a particular code as specified by the respective CTRL signals for the encoding and/or decoding operation(s). In some embodiments, one or more of processing circuits 510, 520, and 526 are capable of performing decoding, while encoding is implemented in programmable circuitry of the IC. In particular embodiments, including any of the embodiments described herein, Turbo processing circuit 520 may not be programmable and may be configured for performing decoding only.

In the example of FIG. 5C, a code configurator (not shown) may be included for each different processing circuit 510, 520, and 526. Each respective code configurator, for example, may write parameters to the appropriate memory 504 and/or provide the CTRL signals described for use by the appropriate processing circuit.

Figure 6:
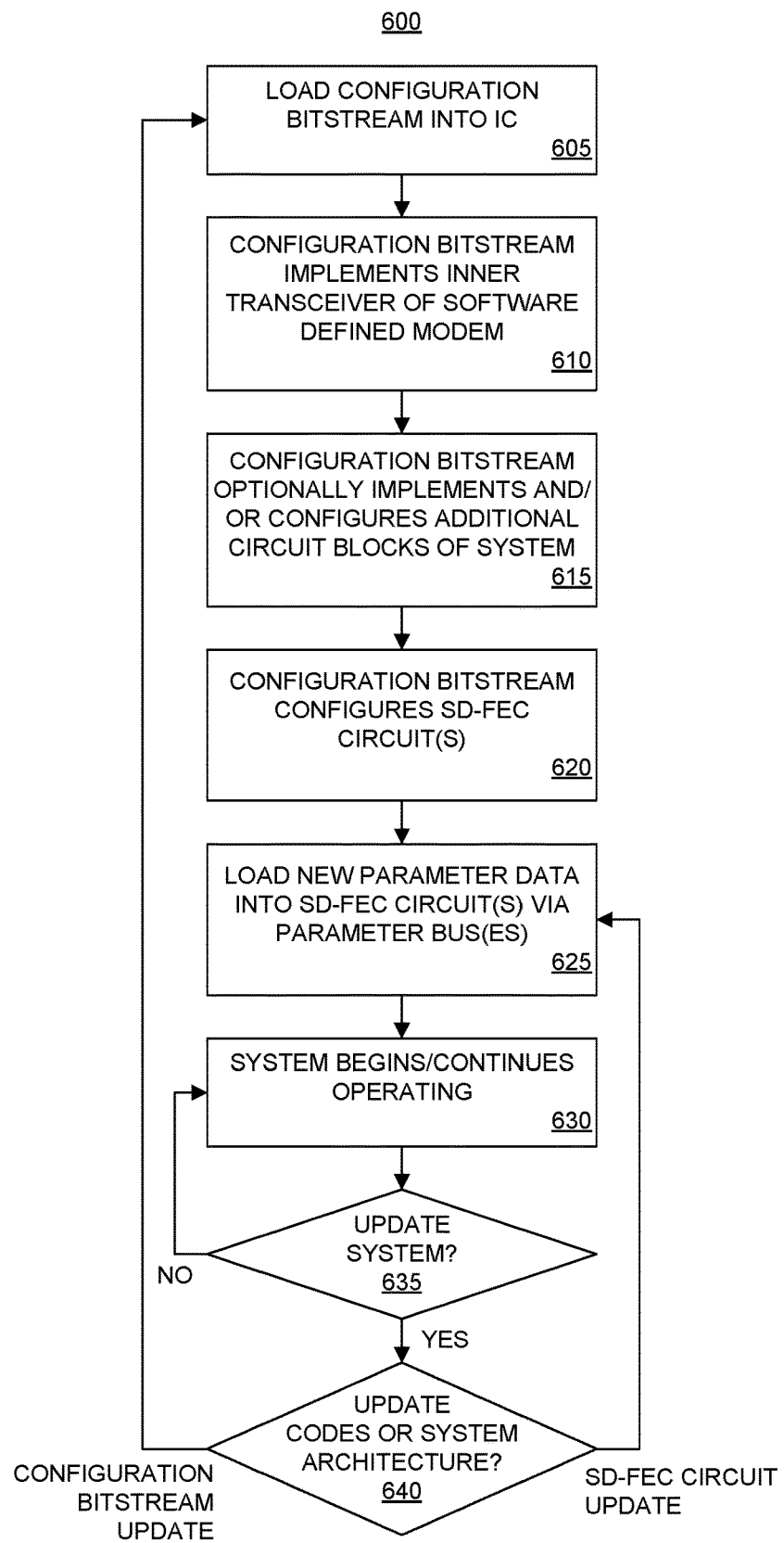
FIG. 6 illustrates an example method of operation for a system that includes a software defined modem.

FIG. 6 illustrates an example method 600 of operation for a system that includes a software defined modem. In one or more embodiments, the system is implemented using an IC that includes programmable circuitry and one or more hardened SD-FEC circuits. In one example, the IC is a programmable IC such as an FPGA or an SoC having programmable circuitry. The SD-FEC circuit(s) may be implemented the same as or similar to the architecture described in connection with FIG. 5A, 5B, or 5C to form the outer transceiver of a software defined modem. Programmable circuitry of the IC is configurable to implement the inner transceiver of the software defined modem and optionally one or more other blocks such as a DFE, HLP, and/or analog interface that couple to the software defined modem.

Figure 8:
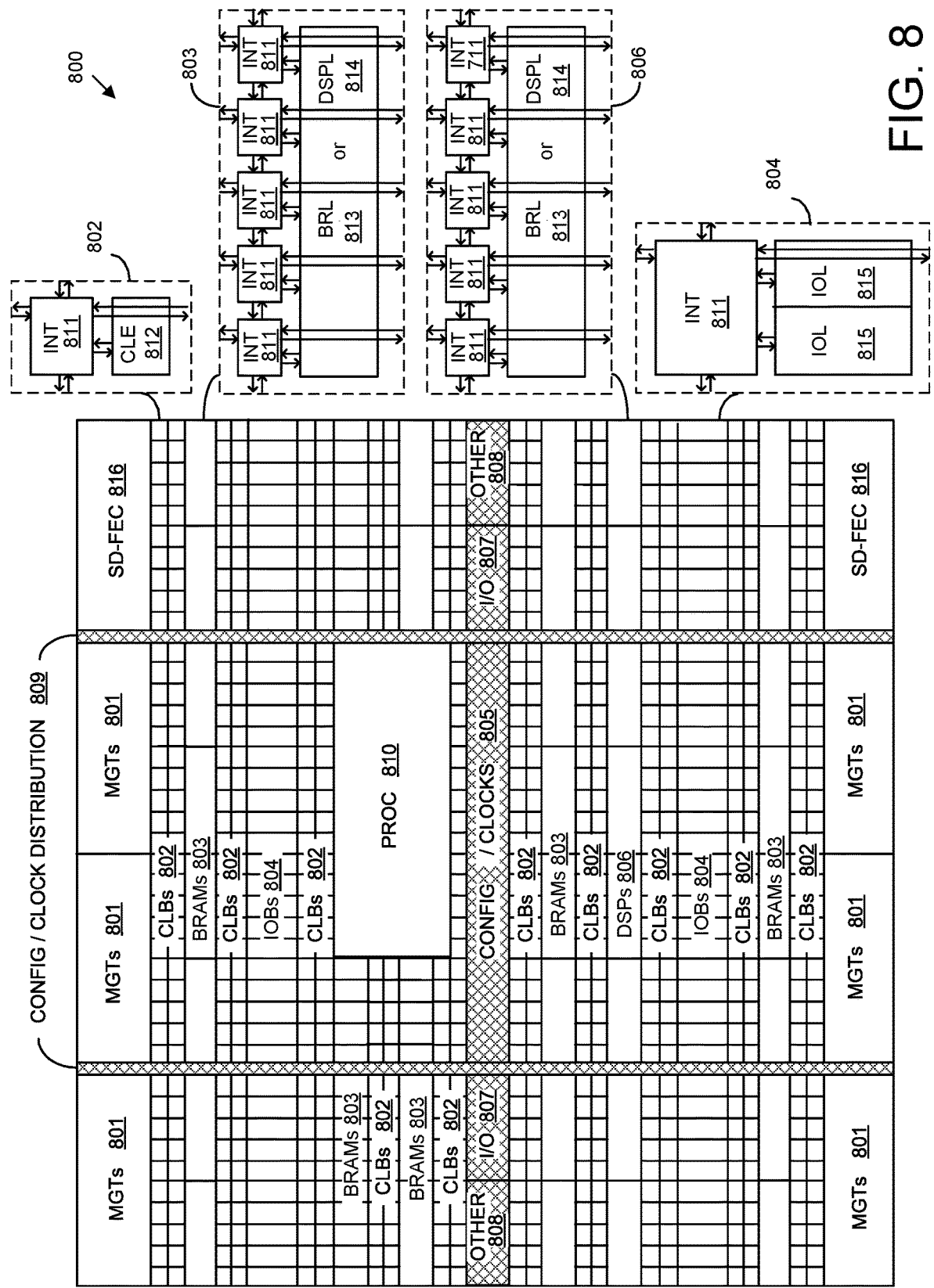
FIG. 8 illustrates an example architecture for an integrated circuit (IC).
Figure 9:
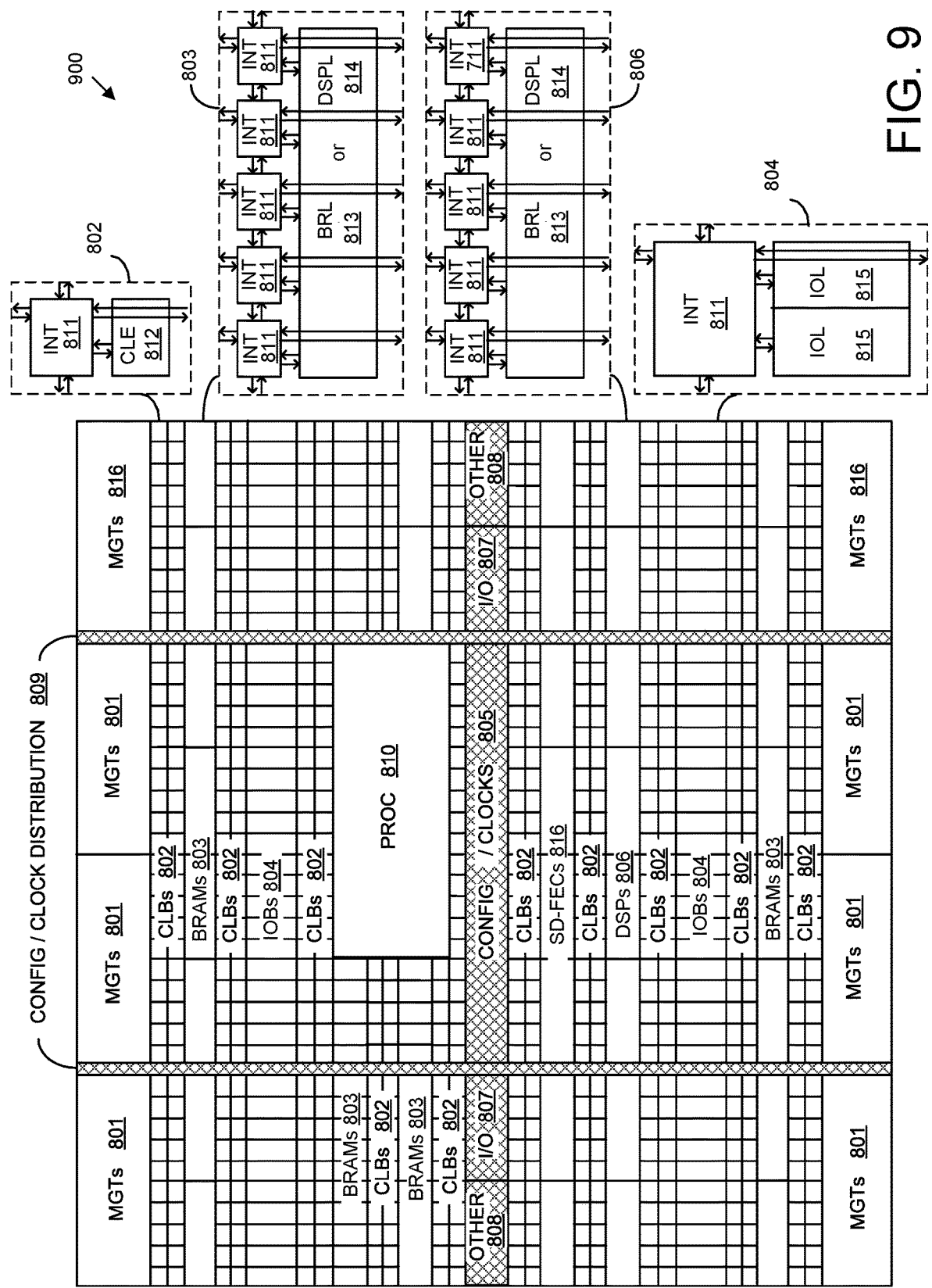
FIG. 9 illustrates another example architecture for an IC.

In one or more other embodiments, the SD-FEC circuit(s) perform only decoding operations for LDPC, Turbo, and/or Polar codes. In that case, the encoder circuits may be implemented in the programmable circuitry of the IC and coupled to the inner transceiver and/or other circuit blocks (e.g., HLP 118) through suitable interface circuitry. An example architecture for an IC capable of implementing systems as described in connection with FIG. 1, 2, 3, 4, or 5 is illustrated in FIGS. 8 and 9.

Method 600 may be implemented using an IC that is included within a larger system. The system may be operating in the field. As such, the operations described in connection with method 600 can be performed while the IC is operating in the field dynamically. In particular embodiments, a circuit such as a configuration controller, a processor, or a processor system within the IC is responsible for loading the configuration bitstream from another memory or source external to the IC.

In block 605, a configuration bitstream is loaded into the IC. The configuration bitstream specifies the circuit architecture that is to be implemented in the IC. For example, the configuration bitstream specifies a circuit architecture for the inner transceiver of the software defined modem and connectivity of the inner transceiver to the outer transceiver. The configuration bitstream further may specify configuration data for the outer transceiver such as register settings and/or parameters to be loaded therein. To the extent the configuration bitstream specifies other circuit blocks such as a DFE and/or an HLP, the configuration bitstream further specifies connectivity of the inner transceiver and the outer transceiver to such other circuit blocks.

In block 610, the configuration bitstream, by virtue of loading into the IC, implements the inner transceiver of the software defined modem within the programmable circuitry of the IC. Example circuit architectures that may be implemented within the IC for the inner transceiver include inner transceivers 106 of FIGS. 1, 2A, 2B, 2C, 3, and 4. The configuration bitstream specifies the particular circuit architecture of the inner transceiver to be implemented in the programmable circuitry and the connectivity of that particular inner transceiver architecture with the hardwired SD-FEC circuit(s) that form the outer transceiver.

In cases where one or more encoder circuits are implemented in the programmable circuitry, the configuration bitstream also specifies such circuits and connectivity of the circuits to the software defined modem, e.g., the inner transceiver, and other circuit blocks such as the HLP.

In block 615, the configuration bitstream optionally implements and/or configures additional circuit blocks of the system. For example, in cases where the system includes a DFE and/or an HLP to be implemented in programmable circuitry of the IC, the configuration bitstream is capable of specifying circuit architectures for each such circuit block and implementing the circuit blocks within the programmable circuitry. The configuration bitstream further specifies connectivity between the DFE, the HLP, the analog interface (if included) and the software defined modem. In cases where the IC includes an analog interface, the configuration bitstream is also capable of specifying configuration information for the analog interface.

In block 620, the configuration bitstream optionally configures the SD-FEC circuit(s) of the outer transceiver of the software defined modem. For example, the configuration bitstream can include parameter data for the SD-FEC circuit(s) that includes one or more register settings, parameters for storage in memory 504, and the like. As discussed, the register settings specify the particular processing circuit that is to be activated or used in cases where more than one processing circuit is included (e.g., LDPC, Turbo, Polar processing circuits). In the example of FIG. 5C, the processing circuits may operate concurrently in parallel. In the examples of FIGS. 5A and 5B, the processing circuits for different types of codes may be enabled one at a time. The parameters can include LDPC codes, Turbo codes, and/or Polar codes for use in encoding and/or decoding data depending upon the particular implementation of the SD-FEC circuit(s).

It should be appreciated that while one type of decoder/encoder circuit may operate at a time, the architectures of FIGS. 5A and 5B still may switch between using one type of decoder/encoder or the other during operation in the field.

In one or more other embodiments, the parameter data for the SD-FEC circuit(s) may be loaded into initialized block-RAMs (BRAMs) within the programmable circuitry of the IC. The BRAMs may be used to load the parameter data, e.g., register settings and/or parameters, into the SD-FEC circuit(s). The BRAMs may be used, for example, to load the SD-FEC circuit(s) after reset and/or before operation.

In block 625, the system is capable of loading parameter data, e.g., new parameters and/or register settings, into memory of the SD-FEC circuit(s) via the parameter bus. As discussed, new LDPC codes, Turbo codes, and/or Polar codes may be loaded into memory of the SD-FEC circuit(s) by using a configuration bitstream. In one or more other embodiments, the parameter data, e.g., parameters and/or register settings of the SD-FEC circuit(s), may be loaded into memory using the parameter bus once the IC is configured with a configuration bitstream. Using the parameter bus, for example, the register settings may be changed to switch back and forth between using the different processing circuits (e.g., the LDPC processing circuit, the Turbo processing circuit, and/or the Polar processing circuit). Further, using the parameter bus, new and/or different codes may be loaded into memory, whether LDPC codes, Turbo codes, or Polar codes.

In block 630, the system implemented within the IC begins operating. In one or more embodiments, the SD-FEC circuit(s) are controllable via the control signals to apply a selected and possibly different code to each different received data block (e.g., a codeword to be decoded or information to be encoded) over time. Further, as discussed, the SD-FEC circuit(s) are capable of performing, and switching between, performing decoding or encoding on a per data block basis based on the received control signals using the code also specified in the control signals. As noted, the SD-FEC circuit(s) are capable of switching between using the LDPC processing circuit, the Turbo processing circuit, and/or the Polar processing circuit over time, e.g., dynamically in response to the values provided via the parameter bus that are stored in the memory. The particular operation, e.g., encoding or decoding, specified by the control signals is performed by the particular processing circuit that is enabled.

In block 635, the IC determines whether an update notification is received. The IC, for example, is capable of receiving a request to update the system implemented therein. In one example, the request is a signal to reconfigure one or more portions of the programmable circuitry by loading a different configuration bitstream therein. In another example, the request is a signal or message received by the IC from an external circuit or system or generated internally within the IC, e.g., by another circuit or a processor therein, to update the SD-FEC circuit(s) in the outer transceiver of the software defined modem.

In response to determining that the system is not to be updated, method 600 loops back to block 635 and continues operating. In response to determining that the system is to be updated, method 600 continues to block 640. In block 640, the system determines whether the update relates to loading a different configuration bitstream into the IC or relates to updating the parameter data of the SD-FEC circuit(s) in the outer transceiver of the software defined modem.

In response to determining that the update involves loading a different configuration bitstream into the IC, method 600 loops back to block 605 to continue processing. By loading a new configuration bitstream into the IC, any circuit block, e.g., the inner transceiver, the DFE, and/or the HLP, can be changed and implemented using a different circuit architecture within the programmable circuitry. Further, in the case where an analog interface is included, the analog interface can be reconfigured with new and/or different configuration data.

In an example, any of the different architectures described in connection with FIG. 1, 2, 3, or 4 may be implemented in the IC by loading a new and/or different configuration bitstream while the IC is deployed in the field. In another example, a newer version of an existing architecture may be implemented in the IC by loading a new and/or different configuration bitstream while the IC is deployed in the field. The update may occur while the IC is operating in the field to add features, address bugs, or the like.

In the case where a new and/or different configuration bitstream is loaded into the IC, it should be appreciated that the SD-FEC circuit(s) of the inner transceiver of the software defined modem also can be reconfigured if so desired. The SD-FEC circuit(s) can be reconfigured by loading different parameter data, e.g., register settings, into memory therein to switch between using Turbo codes (e.g., the Turbo processing circuit), LDPC codes (the LDPC processing circuit), Polar codes (e.g., the Polar processing circuit) and/or loading different parameters into memory specifying different ones of the codes to be used. The parameter data may be included in the configuration bitstream. In one or more embodiments, the settings and/or parameters to be loaded into the SD-FEC circuit(s) may be loaded into BRAMs from the configuration bitstream and then loaded into memory of the SD-FEC circuit(s).

In one or more embodiments, different portions of the system can be specified using different partial configuration bitstreams. For example, using partial reconfiguration techniques, the programmable circuitry of the IC can be subdivided into a plurality of reconfigurable regions, where each region implements a particular circuit block of the system. In this manner, a particular circuit block of the system, e.g., the DFE, the HLP, and/or the inner transceiver of the software defined modem can be changed without changing the surrounding circuitry by loading a partial configuration bitstream that changes only the circuitry within the particular reconfigurable region of the IC that includes the circuit block to be changed.

In response to determining that the update involves reconfiguring some aspect of the SD-FEC circuit(s) of the inner transceiver, e.g., without any other structural changes to the system, method 600 continues to block 625. In block 625, new parameter data, e.g., register settings and/or parameters (e.g., specifying new and/or different codes), may be loaded into the SD-FEC circuit(s) via the parameter bus. After block 625, method 600 continues to block 630 to continue operating.

Figure 7:
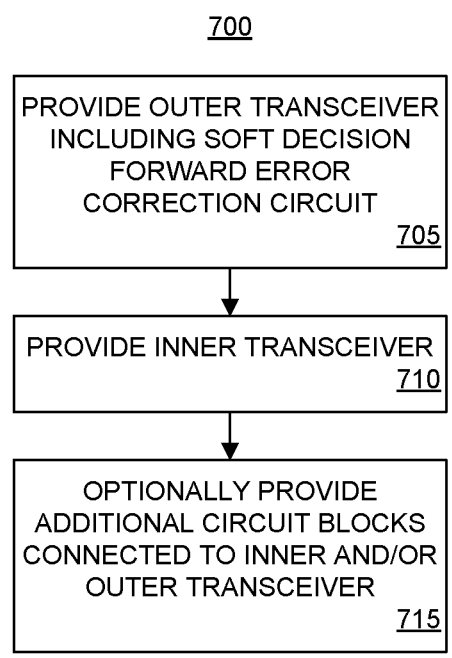
FIG. 7 illustrates an example method of implementing a software defined modem.

FIG. 7 illustrates an example method 700 of implementing a software defined modem. In block 705, an outer transceiver is provided that includes one or more SD-FEC circuits. Each of the SD-FEC circuit(s) is hardwired and programmable to encode and/or decode data using a code type selected from a plurality of different code types. In block 710, an inner transceiver is provided. The inner transceiver is coupled to the SD-FEC circuit(s). The inner transceiver is implemented in programmable circuitry. In block 715, one or more additional circuit blocks are optionally provided that connect to the inner and/or outer transceiver(s). For example, a DFE, an HLP, and/or an analog interface may be provided.

FIG. 8 illustrates an example architecture 800 for an IC. In one aspect, architecture 800 may be implemented within a programmable IC. For example, architecture 800 may be used to implement a field programmable gate array (FPGA). Architecture 800 may also be representative of a system-on-chip (SoC) type of IC. An SoC is an IC that includes a processor that executes program code and one or more other circuits. The other circuits may be implemented as hardwired circuitry, programmable circuitry, and/or a combination thereof. The circuits may operate cooperatively with one another and/or with the processor.

As shown, architecture 800 includes several different types of programmable circuit, e.g., logic, blocks. For example, architecture 800 may include a large number of different programmable tiles including multi-gigabit transceivers (MGTs) 801, configurable logic blocks (CLBs) 802, random access memory blocks (BRAMs) 803, input/output blocks (IOBs) 804, configuration and clocking logic (CONFIG/CLOCKS) 805, digital signal processing blocks (DSPs) 806, specialized I/O blocks 807 (e.g., configuration ports and clock ports), and other programmable logic 808 such as digital clock managers, ADCs, DACs, system monitoring logic, and so forth.

In some ICs, each programmable tile includes a programmable interconnect element (INT) 811 having standardized connections to and from a corresponding INT 811 in each adjacent tile. Therefore, INTs 811, taken together, implement the programmable interconnect structure for the illustrated IC. Each INT 811 also includes the connections to and from the programmable logic element within the same tile, as shown by the examples included at the top of FIG. 8.

For example, a CLB 802 may include a configurable logic element (CLE) 812 that may be programmed to implement user logic plus a single INT 811. A BRAM 803 may include a BRAM logic element (BRL) 813 in addition to one or more INTs 811. Typically, the number of INTs 811 included in a tile depends on the height of the tile. As pictured, a BRAM tile has the same height as five CLBs, but other numbers (e.g., four) also may be used. A DSP tile 806 may include a DSP logic element (DSPL) 814 in addition to an appropriate number of INTs 811. An IOB 804 may include, for example, two instances of an I/O logic element (IOL) 815 in addition to one instance of an INT 811. The actual I/O pads connected to IOL 815 may not be confined to the area of IOL 815.

In the example pictured in FIG. 8, a columnar area near the center of the die, e.g., formed of regions 805, 807, and 808, may be used for configuration, clock, and other control logic. Horizontal areas 809 extending from this column may be used to distribute the clocks and configuration signals across the breadth of the programmable IC.

Some ICs utilizing the architecture illustrated in FIG. 8 include additional logic blocks that disrupt the regular columnar structure making up a large part of the IC. The additional logic blocks may be programmable blocks and/or dedicated circuitry. For example, a processor block depicted as PROC 810 spans several columns of CLBs and BRAMs.

In one aspect, PROC 810 may be implemented as dedicated circuitry, e.g., as a hardwired processor, that is fabricated as part of the die that implements the programmable circuitry of the IC. PROC 810 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 810 may be omitted from architecture 800 and replaced with one or more of the other varieties of the programmable blocks described. Further, such blocks may be utilized to form a "soft processor" in that the various blocks of programmable circuitry may be used to form a processor that can execute program code as is the case with PROC 810.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 8 that are external to PROC 810 such as CLBs 802 and BRAMs 803 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 810.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SoC, the configuration bitstream may specify the circuitry that is to be implemented within the programmable circuitry and the program code that is to be executed by PROC 810 or a soft processor. In some cases, architecture 800 includes a dedicated configuration processor that loads the configuration bitstream to the appropriate configuration memory and/or processor memory. The dedicated configuration processor does not execute user-specified program code. In other cases, architecture 800 may utilize PROC 810 to receive the configuration bitstream, load the configuration bitstream into appropriate configuration memory, and/or extract program code for execution.

In the example of FIG. 8, architecture 800 further includes one or more SD-FEC circuits 816. Each of the SD-FEC circuits 816 is implemented using an architecture the same as or similar to that described in connection with FIG. 5A, 5B, or 5C. In one or more embodiments, SD-FEC circuits 816 may be homogeneous, e.g., each implemented using the architecture of FIG. 5A, or each implemented using the architecture of FIG. 5B, or each implemented using the architecture of FIG. 5C. In one or more other embodiments, SD-FEC circuits 816 may be heterogeneous in that the column may include one or more or any combination of SD-FECs with the architecture of FIG. 5A, the architecture of FIG. 5B, and/or the architecture of FIG. 5C. As discussed, the architecture of FIG. 5A may be implemented by omitting the Turbo processing circuit.

In the example of FIG. 8, SD-FEC circuits 816 may be coupled directly to programmable circuitry of the IC. In one or more embodiments, SD-FEC circuits 816 are coupled to the programmable circuitry using dedicated interconnects (e.g., hardwired interconnect blocks). In one or more other embodiments, SD-FEC circuits 816 are coupled to the programmable circuitry through the existing programmable interconnect circuitry.

FIG. 8 is intended to illustrate an example architecture that may be used to implement an IC that includes programmable circuitry, e.g., a programmable fabric. For example, the number of logic blocks in a column, the relative width of the columns, the number and order of columns, the types of logic blocks and/or SD-FEC circuits included in the columns, the relative sizes of the logic blocks, and the interconnect/logic implementations included at the top of FIG. 8 are purely illustrative. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 810 within the IC are for purposes of illustration only and are not intended as limitations.

FIG. 9 illustrates another example architecture 900 for an IC. Architecture 900 is substantially similar to architecture 800 of FIG. 8. In the example of FIG. 9, SD-FEC circuits 816 are arranged in a column. Each of the SD-FEC circuits 816 is implemented using an architecture the same as or similar to that described in connection with FIG. 5A, 5B, or 5C. In one or more embodiments, SD-FEC circuits 816 may be homogeneous, e.g., each implemented using the architecture of FIG. 5A, or each implemented using the architecture of FIG. 5B, or each implemented using the architecture of FIG. 5C. In one or more other embodiments, SD-FEC circuits 816 may be heterogeneous in that the column may include one or more or any combination of SD-FEC circuits with the architecture of FIG. 5A, the architecture of FIG. 5B, and/or the architecture of FIG. 5C. As discussed, the architecture of FIG. 5A may be implemented by omitting the Turbo processing circuit.

In the example of FIG. 9, SD-FEC circuits 816 may be coupled directly to programmable circuitry of the IC. In one or more embodiments, SD-FEC circuits 816 are coupled to the programmable circuitry using dedicated interconnects (e.g., hardwired interconnect blocks). In one or more other embodiments, SD-FEC circuits 816 are coupled to the programmable circuitry through the existing programmable interconnect circuitry.

In each of the examples of FIGS. 8 and 9, different SD-FEC circuits may be interconnected using the surrounding programmable circuitry to implement the different circuit architectures described within this disclosure.

An example implementation of a programmable decoder and/or encoder is described in U.S. patent application Ser. No. 16/137,935, filed Sep. 21, 2018, which is fully incorporated herein by reference.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without user intervention. As defined herein, the term "user" means a human being.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," "one or more embodiments," "particular embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," "in particular embodiments," and similar language throughout this disclosure may, but do not necessarily, all refer to the same embodiment. The terms "embodiment" and "arrangement" are used interchangeably within this disclosure.

As defined herein, the term "processor" means at least one hardware circuit. The hardware circuit may be configured to carry out instructions contained in program code. The hardware circuit may be an integrated circuit. Examples of a processor include, but are not limited to, a central processing unit (CPU), an array processor, a vector processor, a digital signal processor (DSP), an FPGA, a programmable logic array (PLA), an ASIC, programmable logic circuitry, and a controller.

As defined herein, the term "output" means storing in physical memory elements, e.g., devices, writing to display or other peripheral output device, sending or transmitting to another system, exporting, or the like.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

Certain aspects of the inventive arrangements are described herein with reference to flowchart illustrations and/or block diagrams of methods and apparatus (systems). The flowchart and block diagrams in the Figures illustrate the architecture, functionality, and operation of possible implementations of systems and methods according to various aspects of the inventive arrangements.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow.

The corresponding structures, materials, acts, and equivalents of all means or step plus function elements that may be found in the claims below are intended to include any structure, material, or act for performing the function in combination with other claimed elements as specifically claimed.

In one or more embodiments, a modem includes an outer transceiver including a soft decision forward error correction (SD-FEC) circuit, wherein the SD-FEC circuit is hardwired and programmable to perform at least one of encoding or decoding data using a code type selected from a plurality of different code types, and an inner transceiver coupled to the SD-FEC circuit, wherein the inner transceiver is implemented in programmable circuitry.

In an aspect, the programmable circuitry is configurable to implement different circuit architectures for the inner transceiver.

In another aspect, the inner transceiver includes a modulation circuit configured to modulate the data and a demodulation circuit configured to demodulate the data.

In another aspect, the SD-FEC circuit includes an LDPC processing circuit that is programmable to perform the at least one of encoding or decoding the data using a selected code type.

In another aspect, the plurality of different code types includes LDPC codes compatible with 5G New Radio.

In another aspect, the plurality of different code types includes LDPC codes compatible with Data Over Cable Service Interface Specification (DOCSIS).

In another aspect, the plurality of different code types includes custom LDPC codes.

In another aspect, the plurality of different code types includes Polar codes.

In another aspect, the SD-FEC circuit includes a Turbo processing circuit configured to decode the data using Turbo codes.

In another aspect, the SD-FEC circuit is programmable to perform decoding using the LDPC processing circuit or the Turbo processing circuit.

In another aspect, the modem includes an analog interface coupled to the SD-FEC circuit.

In another aspect, the outer transceiver and the inner transceiver are included within a same IC.

In one or more embodiments, a method of implementing a modem includes providing an outer transceiver including an SD-FEC circuit, wherein the SD-FEC circuit is hardwired and programmable to perform at least one of encoding or decoding data using a code type selected from a plurality of different code types, and providing an inner transceiver coupled to the SD-FEC circuit, wherein the inner transceiver is implemented in programmable circuitry.

In an aspect, the method includes configuring the programmable circuitry to implement a different circuit architecture for the inner transceiver.

In another aspect, the method includes performing, using the inner transceiver, modulation and demodulation of the data.

In another aspect, the plurality of different code types includes a plurality of LDPC code types.

In another aspect, the plurality of different code types includes LDPC codes compatible with 5G New Radio or Polar codes.

In another aspect, the plurality of different code types includes at least one of LDPC codes compatible with Data Over Cable Service Interface Specification DOCSIS or custom LDPC codes.

In another aspect, the method includes programming the SD-FEC circuit to use a selected code type from the plurality of different code types to perform the encoding or decoding of the data.

In another aspect, the plurality of different code types include LDPC codes and Turbo codes. The method includes programming the SD-FEC circuit to perform at least one of encoding or decoding the data using the LDPC codes, or decoding the data using the Turbo codes.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A modem, comprising:
   an outer transceiver including a soft decision forward error correction (SD-FEC) circuit, wherein the SD-FEC circuit is hardwired and programmable to perform at least one of encoding or decoding data using a code type selected from a plurality of different code types; and
   an inner transceiver coupled to the SD-FEC circuit, wherein the inner transceiver is implemented in programmable circuitry.

2. The modem of claim 1, wherein the programmable circuitry is configurable to implement different circuit architectures for the inner transceiver.

3. The modem of claim 1, wherein the inner transceiver comprises:
   a modulation circuit configured to modulate the data; and
   a demodulation circuit configured to demodulate the data.

4. The modem of claim 1, wherein the SD-FEC circuit comprises:
   a low-density parity check (LDPC) processing circuit that is programmable to perform the at least one of encoding or decoding the data using a selected code type.

5. The modem of claim 4, wherein the plurality of different code types includes low-density parity check (LDPC) codes compatible with 5G New Radio.

6. The modem of claim 4, wherein the plurality of different code types includes low-density parity check (LDPC) codes compatible with Data Over Cable Service Interface Specification (DOCSIS).

7. The modem of claim 4, wherein the plurality of different code types includes custom low-density parity check (LDPC) codes.

8. The modem of claim 1, wherein the plurality of different code types includes Polar codes.

9. The modem of claim 1, wherein the SD-FEC circuit comprises:
   a Turbo processing circuit configured to decode the data using Turbo codes.

10. The modem of claim 9, wherein the SD-FEC circuit comprises:
    a low-density parity check (LDPC) processing circuit that is programmable to perform the at least one of encoding or decoding the data using a selected code type;
    wherein the SD-FEC circuit is programmable to perform decoding using the LDPC processing circuit or the Turbo processing circuit.

11. The modem of claim 1, further comprising:
    an analog interface coupled to the SD-FEC circuit.

12. The modem of claim 1, wherein the outer transceiver and the inner transceiver are included within a same integrated circuit.

13. A method of implementing a modem, comprising:
    providing an outer transceiver including a soft decision forward error correction (SD-FEC) circuit, wherein the SD-FEC circuit is hardwired and programmable to perform at least one of encoding or decoding data using a code type selected from a plurality of different code types; and
    providing an inner transceiver coupled to the SD-FEC circuit, wherein the inner transceiver is implemented in programmable circuitry.

14. The method of claim 13, further comprising:
    configuring the programmable circuitry to implement a different circuit architecture for the inner transceiver.

15. The method of claim 13, further comprising:
    performing, using the inner transceiver, modulation and demodulation of the data.

16. The method of claim 13, wherein the plurality of different code types includes a plurality of different low-density parity check (LDPC) code types.

17. The method of claim 16, wherein the plurality of different code types includes low-density parity check (LDPC) codes compatible with 5G New Radio or Polar codes.

18. The method of claim 16, wherein the plurality of different code types includes at least one of low-density parity check (LDPC) codes compatible with Data Over Cable Service Interface Specification (DOCSIS) or custom LDPC codes.

19. The method of claim 16, further comprising:
    programming the SD-FEC circuit to use a selected code type from the plurality of different code types to perform the encoding or decoding of the data.

20. The method of claim 13, wherein the plurality of different code types include low-density parity check (LDPC) codes and Turbo codes, the method, further comprising:
    programming the SD-FEC circuit to perform at least one of:
        encoding or decoding the data using the LDPC codes; or
        decoding the data using the Turbo codes.

* * * * *